United States Patent [19]

Washizaki

[11] Patent Number: 5,389,185
[45] Date of Patent: Feb. 14, 1995

[54] FILM STICKING APPARATUS

[75] Inventor: Yoji Washizaki, Saitama, Japan

[73] Assignee: Somar Corporation, Tokyo, Japan

[21] Appl. No.: 41,329

[22] Filed: Mar. 31, 1993

[30] Foreign Application Priority Data

Apr. 3, 1992 [JP] Japan .................. 4-110655
Jun. 5, 1992 [JP] Japan .................. 4-145742

[51] Int. Cl.⁶ .................. B05C 1/10; B05C 21/00
[52] U.S. Cl. .................. 156/390; 118/501;
118/504; 156/552; 156/555
[58] Field of Search ............. 156/555, 552, 522, 390;
118/504, 241, 501

[56] References Cited

U.S. PATENT DOCUMENTS

| | | | |
|---|---|---|---|
| 2,322,533 | 6/1943 | Mayes | 118/504 |
| 4,377,434 | 3/1983 | Del Bianco | 156/552 |
| 4,961,803 | 10/1990 | Hamamura | 156/552 |
| 4,976,817 | 12/1990 | Correa | 156/552 |
| 4,983,248 | 1/1991 | Seki | 156/555 |
| 5,102,491 | 4/1992 | Correa | 156/555 |
| 5,125,999 | 6/1992 | Sumi | 156/324 |

FOREIGN PATENT DOCUMENTS 0205260 9/1987 Japan .................. 118/504

Primary Examiner—Michael W. Bell
Assistant Examiner—Daniel J. Stemmer
Attorney, Agent, or Firm—Sughrue, Mion, Zinn, Macpeak & Seas

[57] ABSTRACT

In the liquid non-applying operation, an upper and a lower liquid receivers 90A and 90B are located in between a conveyance passage for a base plate 6 and an upper and a lower wet rollers 48A and 48B to prevent an air bubble generation preventive liquid from being applied from the wet rollers to the base plate. In that case, the base plate 6 is conveyed through between the liquid receivers 90A and 90B so that the plate does not come into contact with the wet rollers 48A and 48B. Slide members 114 and hold-down members 116 are provided for the liquid receivers 90A and 90B so that the receivers can be optionally moved in between and out from between the base plate conveyance passage and the wet rollers 48A and 48B to optionally perform either the liquid non-applying operation or the liquid applying operation.

7 Claims, 17 Drawing Sheets

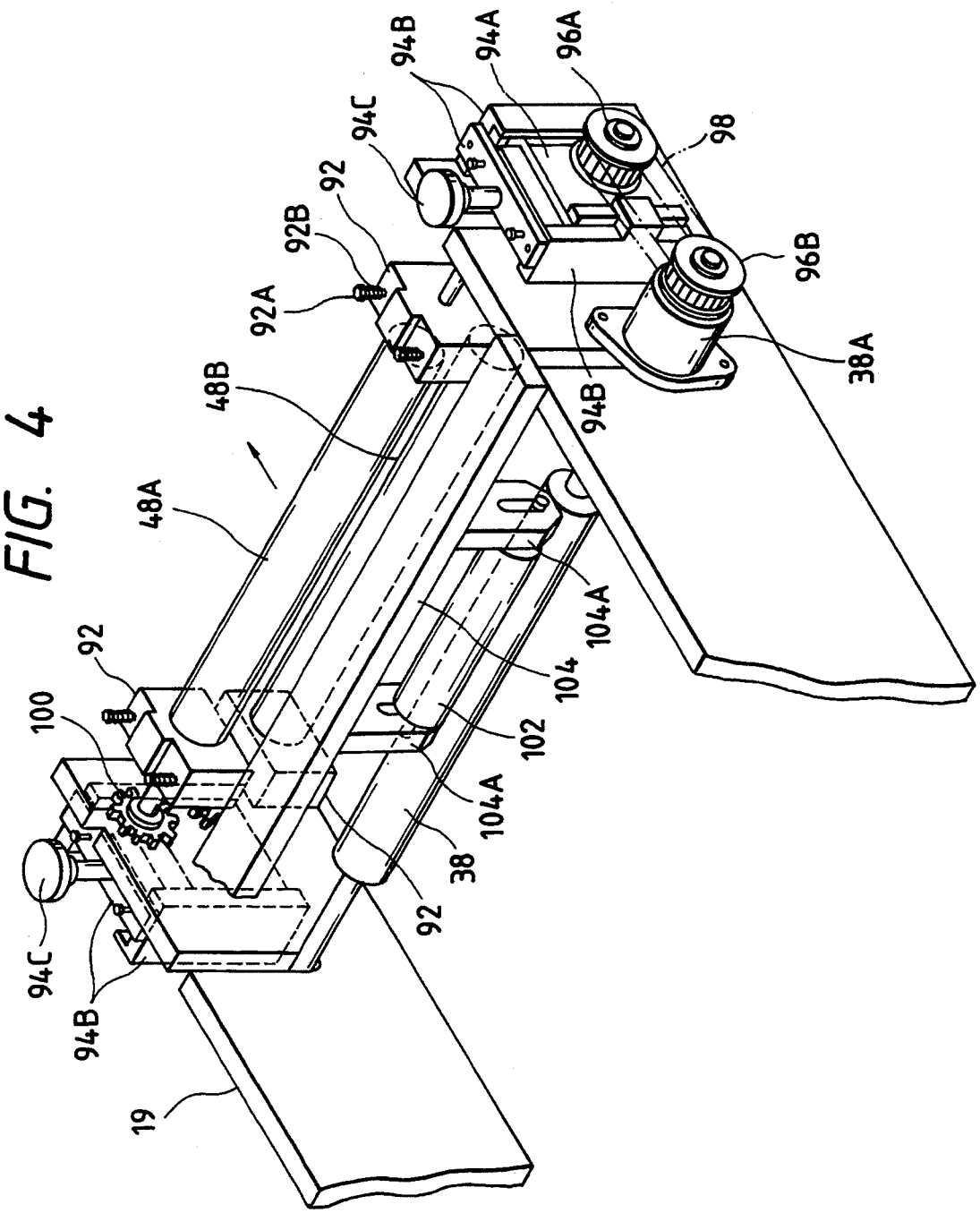

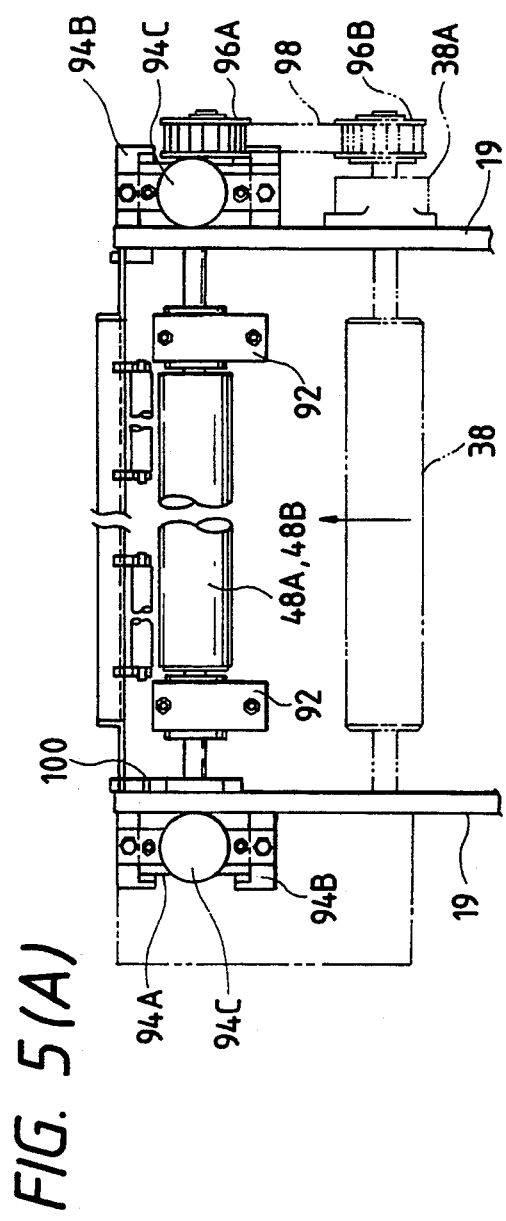
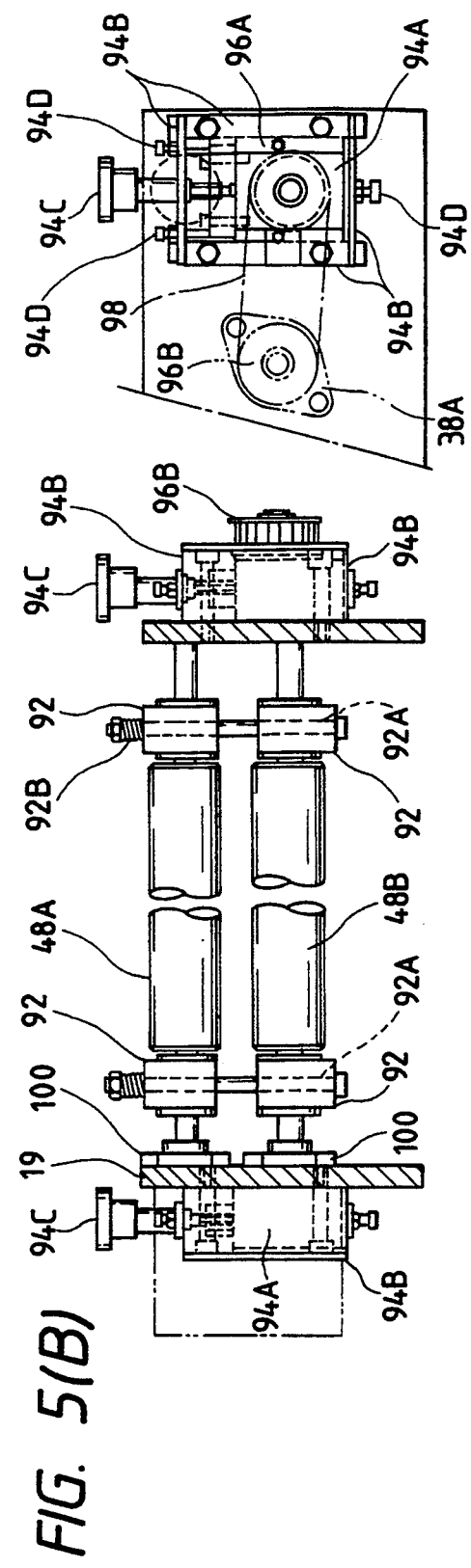
FIG. 5(A)
FIG. 5(B)
FIG. 5(C)

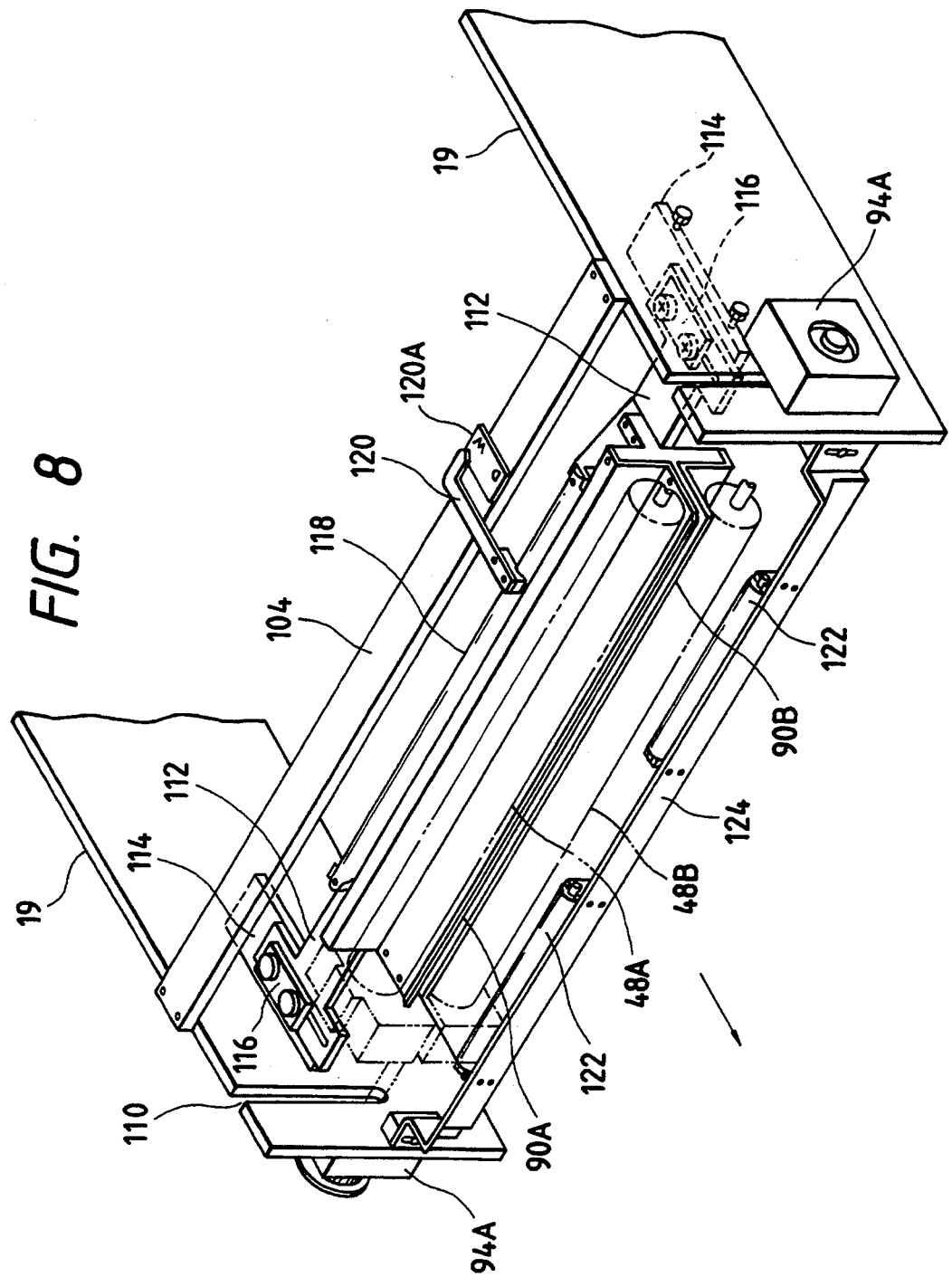

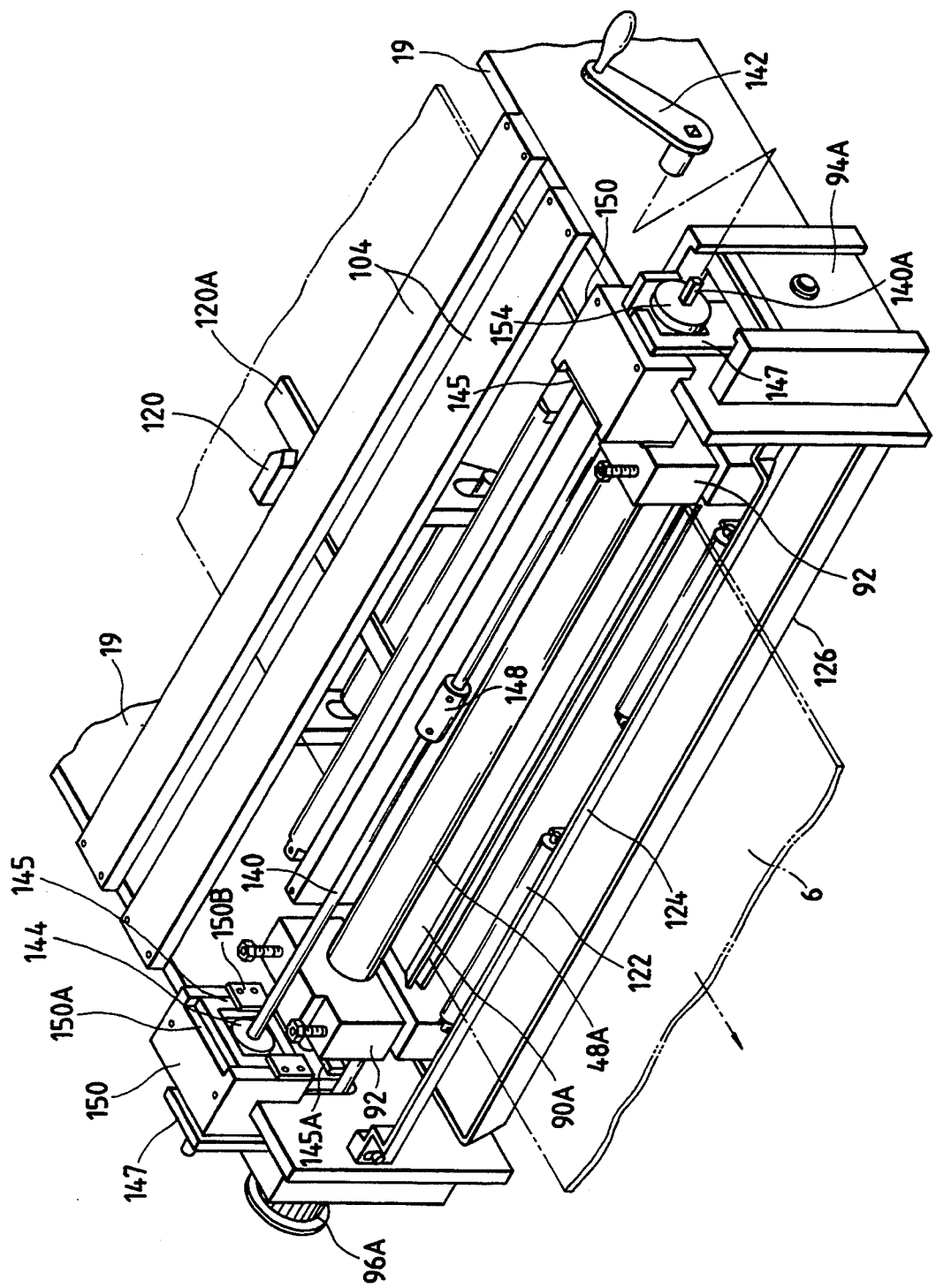

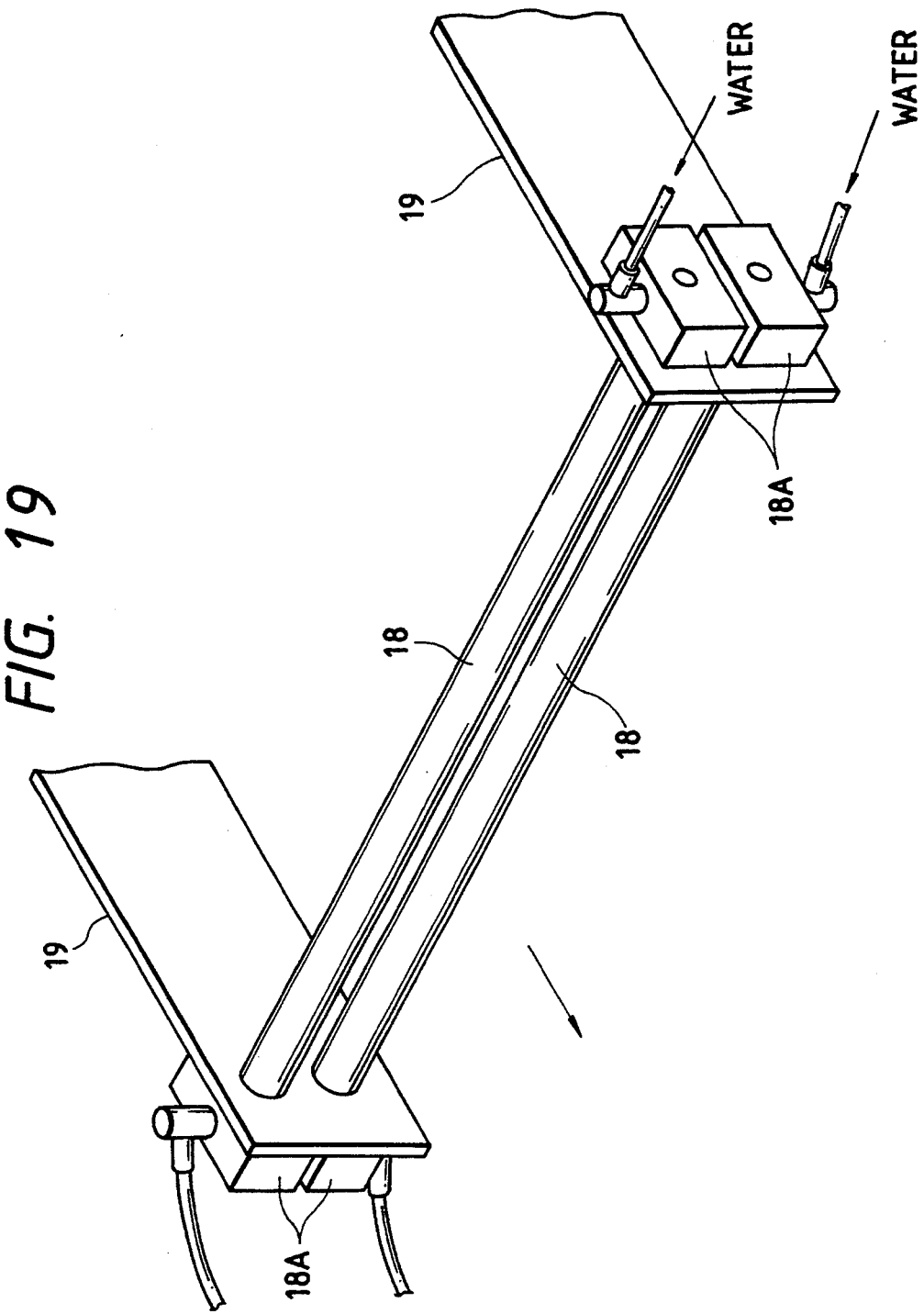

FILM STICKING APPARATUS

BACKGROUND OF THE INVENTION

The present invention relate to a film sticking apparatus having a wet roller for applying an air bubble generation preventive liquid such as water to a base plate so that a film is stuck to the film-stuck surface of the plate by a pressure sticking roller as the liquid remains applied to the surface.

A printed circuit board for an electronic machine such as a computer has wiring made of copper or the like in a prescribed pattern on one or both sides of an electrically insulating base plate. In a process of manufacturing the printed circuit board, a stratified film consisting of a photosensitive resin layer, which is a photoresist layer, and a light-transmissible resin film, which is a protective film for protecting the layer, is first stuck, under heat and pressure, to an electroconductive layer which is a thin copper film provided on the electrically insulating base plate. This heat and pressure sticking is performed by a film sticking apparatus in a mass production manner. As for such apparatuses, various arts were proposed including those disclosed in the Japan Patent Applications (OPI) Nos. 208037/88 and 7344/91 (the term "OPI" as used herein means an "unexamined published application").

FIG. 18 is a schematic side view of a conventional such film sticking apparatus. Since the apparatus is nearly symmetric upward and downward from a conveyance passage for an electrically insulating base plate, FIG. 18 shows only the upper half of the apparatus. In the apparatus, a three-layer stratified film 1 consisting of three layers which are a light-transmissible resin film, a photosensitive resin layer and another light-transmissible resin film is continuously wound on a film supply roller 2 in advance. The film 1 is unwound from the supply roller 2 so that a film separation roller 3 separates the film into the light-transmissible resin film 1A and a two-layer stratified film 1B consisting of the other light-transmissible resin film and the photosensitive resin layer exposed on one side thereof, which is to be stuck to the base plate. The separated stratified film 1B is fed to the surface of a main vacuum suction plate 5 (which is a film feed member) along a tension roller 9. An auxiliary vacuum suction plate 13 and a cutter 14 are provided at the feed passage for the stratified film 1B downstream of the main vacuum suction plate 5 with regard to the direction of the feed of the film. A vacuum suction bar 15 and a pressure sticking roller 16 are provided at the feed passage for the film 1B downstream of the cutter 14. The pressure sticking roller 16 is generally made of a metal tube and a rubber sheet provided on the outer circumferential surface of the tube. The main vacuum suction plate 5 is for tentatively sticking the stratified film 1B to an electroconductive layer on the base plate 6 while holing the film on the suction plate by vacuum suction. The main vacuum suction plate 5 is supported by a support member 7 so as to be movable up and down. The support member 7 can be moved toward and away from the base plate 6 in directions B. The support member 7 is attached with a guide member 8 to the body frame 9 of the apparatus so that the support member can be moved in the directions B while sliding on the guide member. A pair of such support members 7 are provided over and under the conveyance passage for the base plate 6 so that the support members are moved up and down in conjunction with each other through the action of a rack and pinion mechanism by a fist driver not shown in FIG. 14. The mechanism includes racks 7A provided on the support members 7, and a pinion 7B engaged with the racks and supported by the body frame 9 of the apparatus.

The main vacuum suction plate 5 is supported by the support member 7 so that the plate can be moved toward and away from the base plate 6 in directions C, independently of the movement of the support member, by a second driver 11 such as a pneumatic cylinder through the action of a rack and pinion mechanism provided on the support member 7. The mechanism includes a first rack 12A secured to the support member 7, a pinion 12B engaged with the rack so as to be moved up and down along the rack by the driver 11, and a second rack 12C engaged with the pinion so as to be moved up and down in parallel with the former rack. The main vacuum suction plate 5 has a tentatively-sticking downstream end portion 5A in which a heater 5B is provided. To tentatively stick the stratified film 1B to the base plate 6 by the main vacuum suction plate 5, the tentatively-sticking portion 5A thereof is moved to the vicinity of the base plate or into contact therewith as the film remains held on the portion. At that time, the portion 5A is heated by the heater 5B to tentatively stick the film 1B at the leading edge thereof to the base plate under heat and pressure.

The auxiliary vacuum suction plate 13 sucks the stratified film 1B at the leading edge thereof and moves so that the edge of the film is held on the tentatively-sticking downstream end portion 5A of the main vacuum suction plate 5 by suction. For that purpose, the auxiliary vacuum suction plate 13 is moved toward and away from the feed passage for the stratified film 1B in directions D by a driver 13A such as a pneumatic cylinder fastened to the support member 7.

The cutter 14 is opposed to the auxiliary vacuum suction plate 13 across the feed passage for the stratified film 1B in order to cut off the film 1B to a length corresponding to that of the base plate 6.

A pair of pressure sticking rollers 16 are also provided over and under the base plate conveyance passage. The upper and the lower stratified films 1B tentatively stuck to the upper and lower sides of the base plate 6 are pinched thereon under prescribed pressure by the sticking rollers 16 and also heated by them so that the films are completely stuck to the base plate under heat and pressure.

In such film sticking appratus, there is a possibility that a fine air bubble or void space is generated in between the base plate 6 and the film 1B during the sticking thereof to the base plate. This air bubble deteriorates the close adhesion or sticking between the film 1B and the base plate 6. In particular, in case of an insulative base plate on which a wiring pattern having an extremely small wiring line width is formed, this air bubble causes the partial defect of the wiring line, and therefore a defective product is manufactured through the sticking. For that reason, it is necessary to enhance the tightness of the contact of the film 1B and the base plate 6 to prevent the generation of the air bubble, especially in the case that the tightness is likely to fall due to the complicatedness of a wiring pattern. Since applying an air bubble generation preventive liquid such as water to the base plate 6 before the sticking of the film 1B thereto is an effective way of preventing the air bubble from being generated in between the base plate and the film during the sticking, a film sticking apparatus includes wet rollers 18 for applying the liquid to the film-stuck sides of the base plate before the sticking. FIG. 19 shows the state that the conventional wet rollers 18 are provided at the base plate conveyance passage. Shown at 19 and 18A in FIG. 19 are side plates supporting conveyance rollers, and liquid supply blocks, respectively. The wet rollers 18 are in an upper and a lower fixed positions upstream of the pressure sticking rollers 16 so that the upper and lower sides of the base plate 6 come into contact with the wet rollers. For example, the wet roller 18 is that disclosed in the Japan. Patent Application (OPI) No. 7344/91. The wet roller 18 is mainly made of a liquid supply tube, and a coating layer. The tube is a cylindrical body made of a rust-resistant metal such as stainless steel, or a hard plastic, and having a plurality of liquid supply holes. The coating layer is made of a liquid-absorbing porous substance such as sponge, and provided on the outer circumferential surface of the tube. To apply the air bubble generation preventive liquid to the base plate 6 by the wet rollers 18, the liquid is sent into the tubes of the rollers through the ends of the tubes so that the liquid enters into the coating layers of the rollers through the liquid supply holes of the tubes to wet the layers. The upper and lower sides of the base plate 6 come into contact with the coating layers of the wet rollers 18 along with the rotation thereof so that the liquid is applied to the sides. The operation of the apparatus, in which the liquid is applied to the base plate, is herein referred to as wet operation.

There is a kind of a base plate to which such an air bubble generation preventive liquid does not need to be applied. For example, an insulative base plate on which a wiring pattern having not-extremely small wiring line width is to be formed, is that kind. The stratified film is stuck to that kind of base plate by a film sticking apparatus having no such wet roller, or is stuck to the base plate by the former apparatus removed of the wet rollers 18. The operation of the apparatus, in which the liquid is not applied to the base plate, is herein referred to as dry operation.

The wet operation in which the air bubble generation preventive liquid is applied to the base plate, and the dry operation in which the liquid is not applied to the other base plate, sometimes need to be alternately performed. It is conceivable that a film sticking apparatus capable of applying the liquid to the base plate, and a film sticking apparatus not capable of doing so are provided to be alternately used to perform the wet and the dry operations. However, if these different types of apparatuses are provided and alternately used, one of them is always idle and the efficiency of the use of them is therefore low.

If the wet and the dry operations are to be alternately performed by the single conventional apparatus shown in FIG. 18, the wet rollers 18 are left for the wet operation and replaced with dry rollers for the dry operation. However, it takes much time and trouble to attach and detach the wet rollers to and from the apparatus, especially it is very time-consuming to properly position the wet rollers at the base plate conveyance passage. Therefore, often alternately performing the wet and the dry operations by the apparatus is a very heavy work load which is a large impediment to continuously and rapidly operate the apparatus. This is a problem.

SUMMARY OF THE INVENTION

The present invention was made in order to solve the above-mentioned problem. Accordingly, it is an object of the invention to provide a film sticking apparatus in which a wet operation in which an air bubble generation preventive liquid such as water is applied to a base plate, and a dry operation in which the liquid is not applied thereto can be easily changed for each other in a short time not to much increase a work load and much impede operating the apparatus continuously and rapidly.

The film sticking apparatus includes a wet roller for applying the liquid to the base plate so that a film is stuck to the film-stuck surface of the plate by a pressure sticking roller as the liquid remains applied to the surface. The apparatus is characterized by including a liquid application preventive member for preventing the liquid from being applied from the wet roller to the base plate; and an operation selective means for selecting the wet operation or the dry operation by moving the member out from between the wet roller and a base plate conveyance passage or in between them.

The film sticking apparatus provided in accordance with the present invention includes the liquid application preventive member which is for preventing the air bubble generation preventive liquid from being applied from the wet roller to the base plate in the dry operation and can be displaced to optionally perform either the wet operation or the dry operation. The wet and the dry operations can thus be easily changed for each other in the short time. For that reason, often changing the wet and the dry operations for each other does not much increase the work load, and much impede operating the apparatus continuously and rapidly.

BRIEF DESCRIPTION OF THE DRAWINGS

In the accompanying drawings:

FIG. 4 is a perspective view of the shaft support means for the lower wet roller and the vicinity thereof.

FIGS. 5A, 5B and 5C are a plan view, a front view and a side view of the lower wet roller and the shaft support means therefor, respectively;

FIG. 8 is a perspective view of the liquid receivers and the vicinity thereof;

FIG. 14 is a perspective view shaft support means and the vicinity thereof in an second embodiment of the present invention;

FIG. 19 is a perspective view of conventional wet rollers.

DETAILED DESCRIPTION OF THE PREFERRED EMBODIMENTS

An embodiment of the present invention is hereafter described with reference to the drawings attached hereto.

Figure 1:
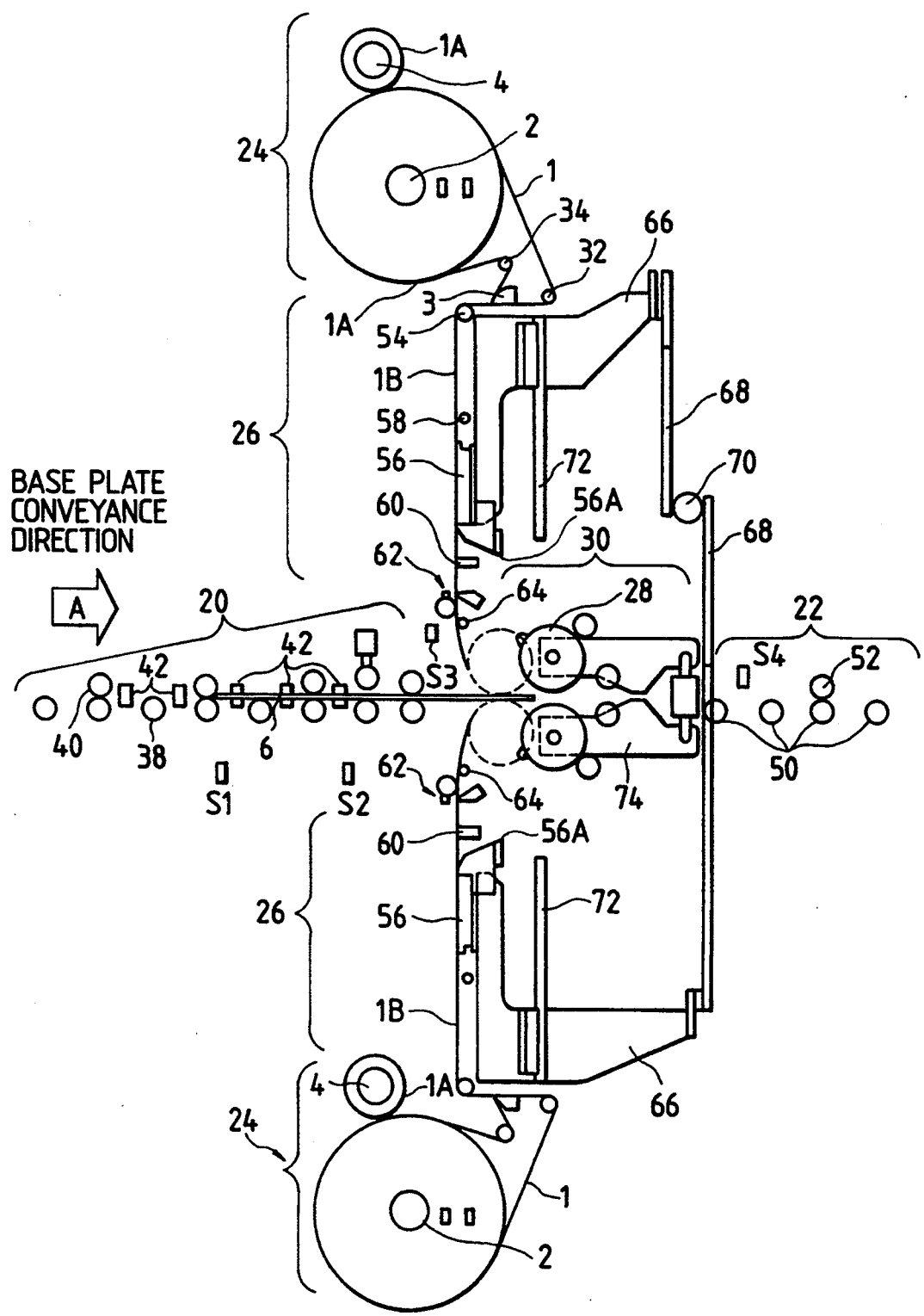
FIG. 1 is a schematic side view of a film sticking apparatus which is an embodiment of the present invention.
Figure 2:
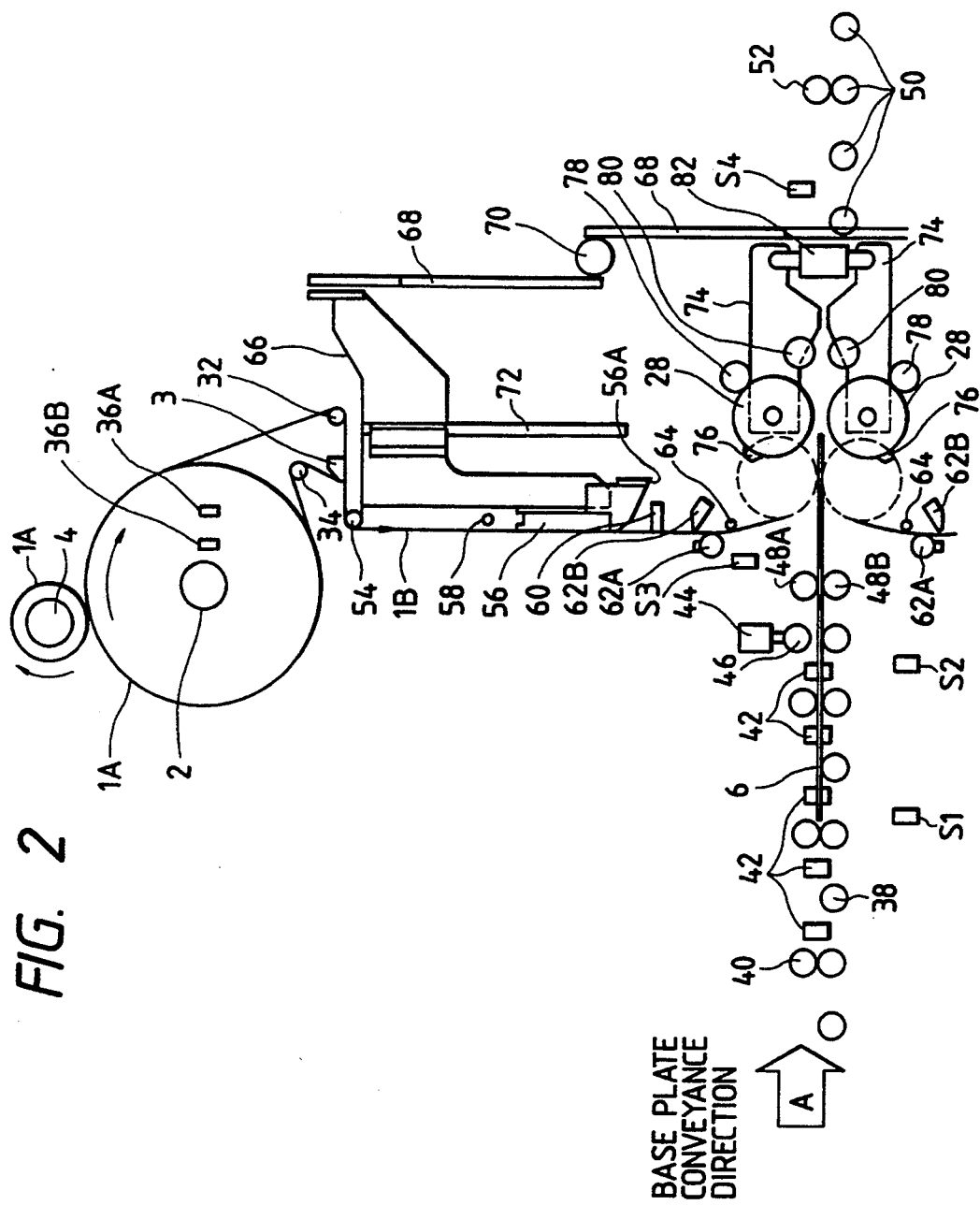
FIG. 2 is a schematic side view of the upper half of the apparatus and the vicinity of a base plate conveyance passage.

FIG. 1 is a schematic side view of a film sticking apparatus which is the embodiment and operates so that an upper and a lower stratified films 1B each having a length corresponding to that of an electrically insulating base plate 6 are stuck to the upper and lower sides of the plate, respectively. FIG. 2 shows the upper half of the apparatus and the vicinity of a base plate conveyance passage extending as the center line for the upper and lower halves of the apparatus. The apparatus mainly includes a base plate convey-in section 20 for conveying in the base plate 6 to tentative sticking position and a complete sticking position, a base plate convey-out section 22 for conveying out the base plate with the stratified films 1B completely stuck thereto under heat and pressure, stratified film storage sections 24 for storing three-layer stratified films 1 each consisting of a light-transmissible resin film, a photosensitive resin layer and another light-transmissible resin film, and for feeding the stratified films 1B each consisting of the light-transmissible resin film and the photosensitive resin layer exposed on the stuck side thereof, tentative sticking sections 26 for tentatively sticking the two-layer stratified films 1B at the leading edges thereof to the upper and lower sides of the base plate, and a pressure sticking section 30 which operates so that the two-layer stratified films 1B tentatively stuck at the leading edges thereof to the upper and lower sides of the base plate are completely stuck to the sides under heat and pressure by pressure sticking rollers 28.

In each of the stratified film storage sections 24, the three-layer stratified film 1 is continuously wound on a film supply roller 2 in advance so that the film is stored. The film 1 is unwound from the roller 2 to a film separation roller 3 along a guide roller 32 so that the separation roller separates the film into the light-transmissible resin film 1A as a protective film, and the two-layer stratified film 1B consisting of the other light-transmissible resin film and the photosensitive resin layer exposed on the film sticking side thereof, which is to be stuck to the base plate 6. The separated light-transmissible resin film 1A is wound onto a winding roller 4 along a guide roller 34 and the three-layer stratified film 1. A large film winding diameter sensor 36A, FIG. 2, for detecting that the diameter of the winding of the stratified film 1 on the film supply roller 2 is larger than a prescribed value, and a small film winding diameter sensor 36B, FIG. 2, for detecting that the diameter is smaller than a prescribed value are provided alongside the film wound on the roller.

In the base plate convey-in section 20, a plurality of drive rollers 38 are provided at appropriate intervals along a base plate convey-in passage to apply driving forces to the base plate 6 to convey it. Motive power is applied to the drive rollers 38 from a driver such as a motor to rotate the rollers. Idle rollers 40 are provided opposite every second ones of the drive rollers 38 or appropriate ones of them across the base plate conveyance passage so that the idle rollers and the drive rollers pinch the base plate 6 to surely apply the driving forces thereto. Sideward positioners 42 are provided in appropriate positions between the drive rollers 38 along the base plate conveyance passage to put the base plate 6 in a prescribed position sidewards. A base plate hold-down roller 46, FIG. 2, is provided opposite the most downstream (as to the direction of the conveyance of the base plate 6) drive roller 38 across the conveyance passage near the upstream end of the pressure sticking section 30 so that the hold-down roller can be moved up and down by a base plate hold-down means 44, FIG. 2, made of a pneumatic cylinder. When the base plate hold-down roller 46 is moved down by the base plate hold-down means 44, the base plate 6 is pinched between the hold-down roller and the corresponding drive roller 38 so that the base plate is prevented from vertically moving as the stratified films 1B are tentatively stuck to the base plate or completely stuck thereto. Wet rollers 48A and 48B, FIG. 2, are provided downstream of the most downstream drive roller 38 to apply an air bubble generation preventive liquid such as water to the base plate to prevent an air bubble from being generated in between the base plate and each of the stratified films 1B being completely stuck thereto. Sensors S1, S2 and S3 for the base plate 6 are provided near the base plate conveyance passage. The upstream sensor S1 is a sideward positioning start location sensor which detects the leading edge of the base plate 6 introduced into the base plate convey-in section 20 and sends out a detection signal to put the sideward positioners 42 into action. The intermediate sensor S2 is a base plate trailing edge sensor provided downstream of the sideward positioning start location sensor S1 in order to detect the trailing edge of the base plate 6. The downstream sensor S3 is a base plate leading edge sensor provided near the upstream end of the pressure sticking section 30 in order to detect the leading edge of the base plate 6.

In the base plate convey-out section 22, a plurality of drive rollers 50 are provided so that the rollers are rotated by a motor to apply drive forces to the base plate 6 to convey it. Idle rollers 52 are provided opposite appropriate ones of the drive rollers 50 across the base plate conveyance passage so that the base plate 6 is pinched between the idle rollers and the drive roller to surely apply the driving forces to the base plate. A base plate passing sensor S4 is provided in the convey-out section 22 near the downstream end of the pressure sticking section 30 in order to detect the passing of the base plate 6.

Each stratified film 1B is fed from the stratified film storage section 24 to the tentative sticking section 26 along a tension roller 54 which is for applying an appropriate tensile force to the film between the film supply roller 2 and a main vacuum suction plate 56 (which is a film feed member) to prevent the film from undergoing a wrinkle or the like while being fed to the main vacuum suction plate. A static electricity eliminator 58 is provided at the feed passage from the stratified film 1B between the tension roller 54 and the main vacuum suction plate 56 to eliminate static electricity from the film. A film holding member 60, cutter 62 and a support roller 64 are provided at a stratified film feed passage between the main vacuum suction plate 56 and the pressure sticking section 30.

The main vacuum suction plate 56 sucks the stratified film 1B at the leading edge thereof on the plate along with the feed of the film from the supply roller 2, and is moved toward the leading edge of the conveyed base plate 6 to tentatively stick the film to the upper or lower side of the base plate at the leading edge thereof. The suction plate 56 is secured to mounting member 66 so that they are moved together. The upper and the lower main vacuum suction plates 56 simultaneously and equally suck the upper and the lower films 1B, and are simultaneously and equally moved toward the base plate 6 to tentatively stick the films thereto.

The film holding member 60 sucks the stratified film 1B at the leading edge thereof by negative pressure, and is moved back along the direction A of the conveyance of the base plate 6 so that the film is sucked and wound on the tentatively-sticking downstream end portion 56A of the main vacuum suction plate 56.

The cutter 62 has a rotary cutting member 62A having a cutting edge, which extends like a part of a spiral on the outer circumferential surface of the cylindrical member, and a fixed cutting member 62B having a straight cutting edge. The stratified film 1B being fed across the fixed cutting member 62B is cut off by the cutter 62 perpendicularly to the direction of the feed of the film as the rotary cutting member 62A is rotated to approach the fixed cutting member 62B to cut off the film to the prescribed length corresponding to that of the base plate 6. In order to cut off the film 1B by the cutter 62 perpendicularly to the direction of the feed thereof, one end of each of the rotary and the fixed cutting members 62A and 62B is moved along the direction of the feed of the film during the feed so that the component of the speed of the movement of the point of the cutoff by the cutter, in the direction of the feed, is equalized to the speed of the feed.

The support roller 64 is provided on film feed passage between the cutter 62 and the pressure sticking roller 28 so as to be located on the same plane as the film feed passage on the suction surface of the main vacuum suction plate 56. The support roller 64 is for guiding the stratified film 1B to smoothly send it to the pressure sticking roller 28 after the cutoff of the film by the cutter 62 so that the film does not undergo a wrinkle or the like.

The upper and the lower mounting members 66, to which the upper and the lower main vacuum suction plates 56 are secured, are similarly provided as shown in FIG. 1. Racks 68 are provided on the mounting members 66 and engaged with pinions 70 to simultaneously and equally move the mounting members toward the base plate 6 together with the main vacuum suction plates 56 while sliding the members on guide rails 72. The pinions 70 are rotated in prescribed positions on the body frame of the apparatus by a servomotor to simultaneously and equally move the upper and the lower racks 68 and the upper and the lower main vacuum suction plates 56. A pair of pneumatic cylinders are coupled at the tubular bodies and piston rods thereof to the upper and the lower mounting members 66 along the directions of the widths of the upper and the lower main vacuum suction plates 56 to simultaneously and equally move the mounting members toward and away from each other. The servomotor is driven to move the main vacuum suction plates 56 toward the base plate 6 to set a prescribed distance between the base plate and each main vacuum suction plate. After that, the servomotor is disengaged, and the pneumatic cylinders are driven to move the main vacuum suction plates 56 to tentatively stick the stratified films 1B at the leading edges thereof to the base plate 6 at the leading edges thereof, and thereafter driven back to move the main vacuum suction plates away from the base plate.

The pressure sticking section 30 includes the pressure sticking rollers 28 for completely sticking the stratified films 1B to the upper and lower sides of the base plate 6 under heat and pressure, pressure sticking roller support members 74 supporting the rollers movably back and forth, vacuum suction bars 76, FIG. 2, which are turned around the rollers while suck the films on the bars, pressure roller wiping rollers 78, FIG. 2, for wiping the air bubble generation preventive liquid off the pressure sticking rollers, base plate wiping rollers 80, FIG. 2, for wiping the liquid off the upper and lower sides of the base plate after the complete sticking of the films thereto, and two pneumatic cylinders 82, FIG. 2, for swinging the upper and the lower pressure sticking roller support members symmetrically to each other to vertically move the pressure sticking rollers to completely stick the film to the upper and lower sides of the base plate by the pressure sticking rollers. The base plate wiping rollers 80 are rotatably supported by the pressure sticking roller support members 74 downstream of the pressure sticking rollers 28 to wipe the air bubble generation preventive liquid off the base plate 6. The right and the left pneumatic cylinders 82 are provided for the right pair of upper and lower support members 74 and the left pair of upper and lower support members 74 to vertically move the pressure sticking rollers 28.

Figure 3:
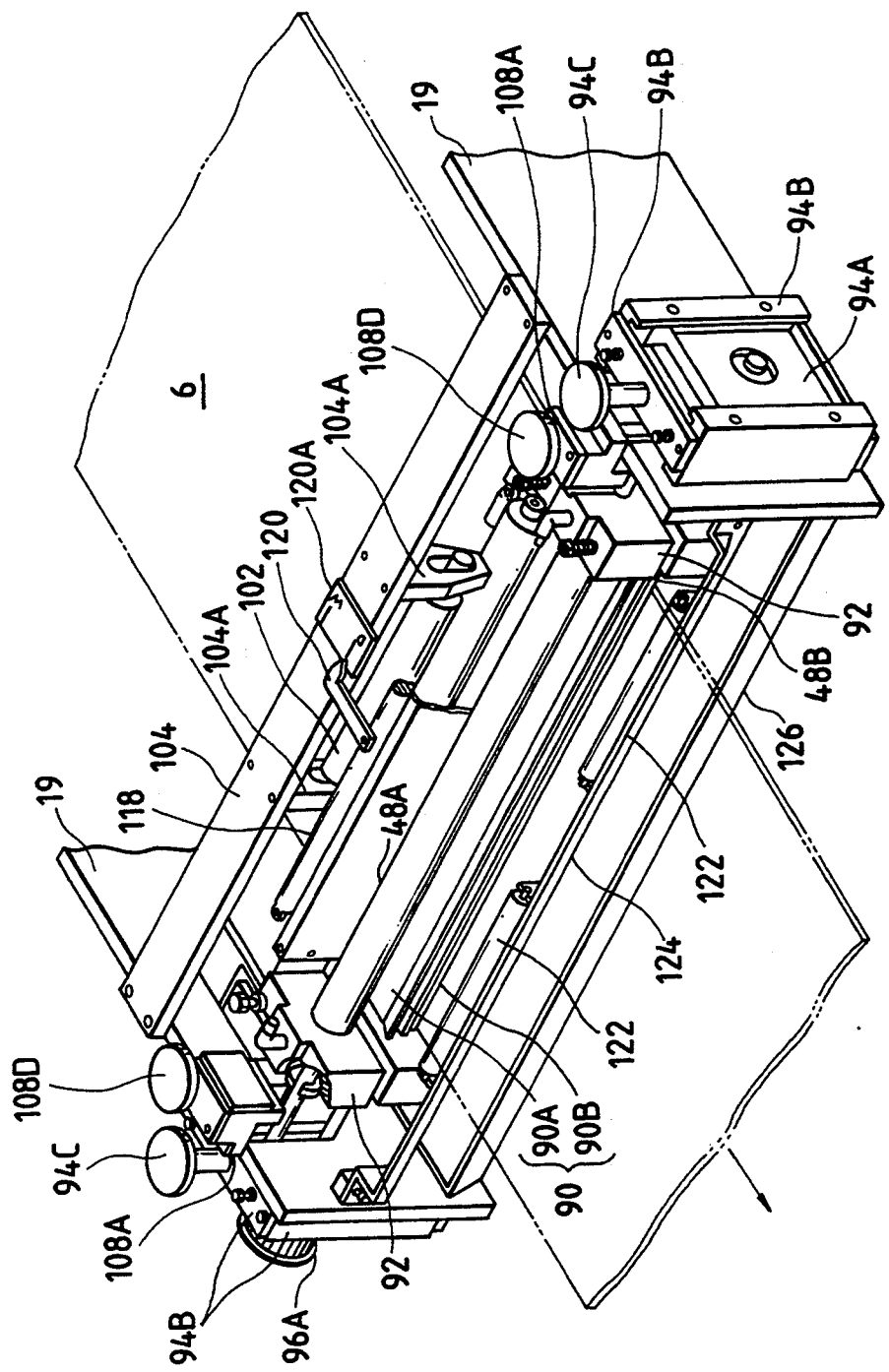
FIG. 3 is a perspective view of the wet roller and liquid receivers of the apparatus.
Figure 6:
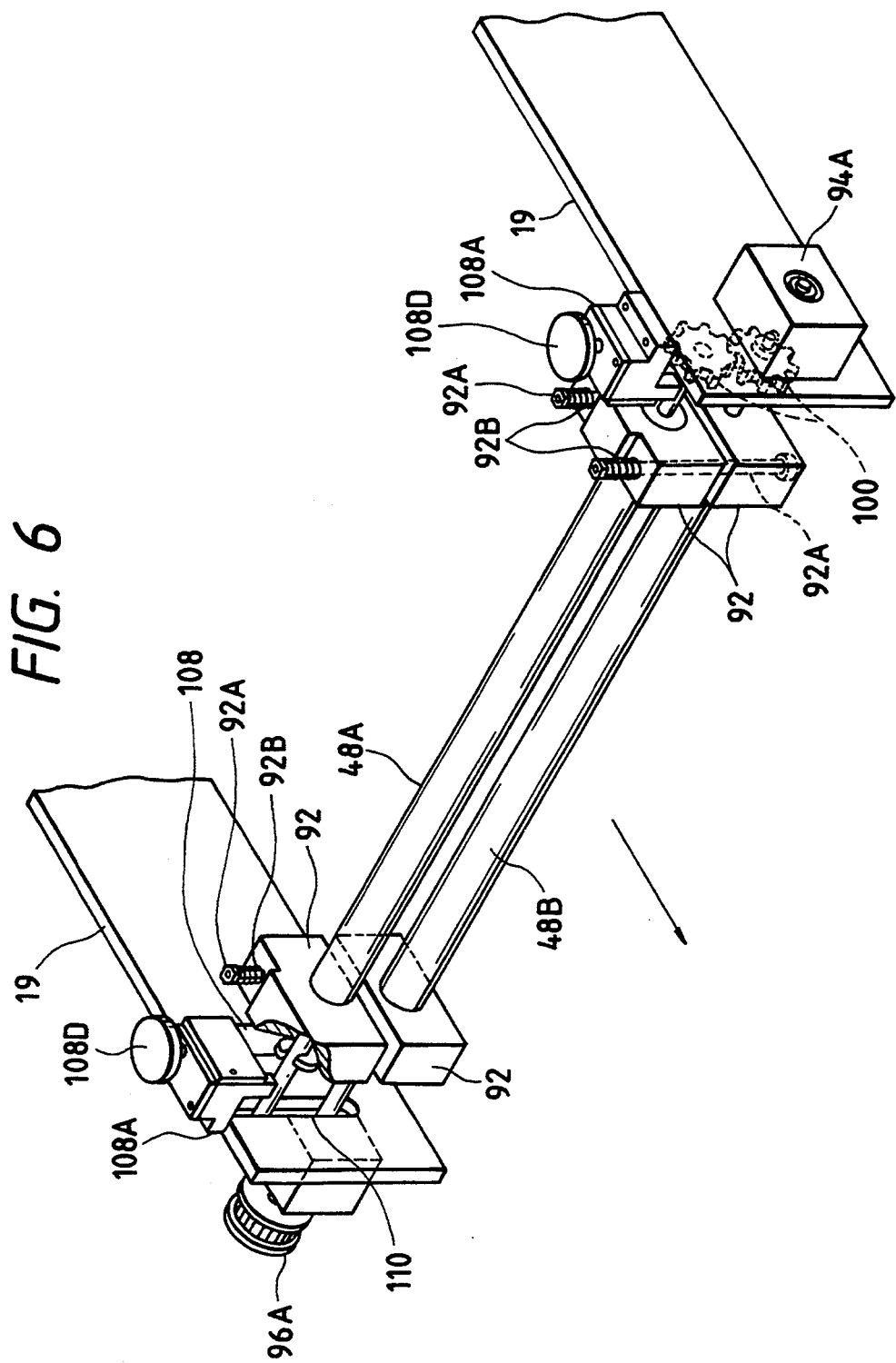
FIG. 6 is a perspective view of the upper and the lower wet rollers and the shaft support means of the upper wet roller.

The upper wet roller 48A and the lower wet roller 48B can be moved up and down independently of each other to optionally perform either of the wet and the dry operations of the apparatus as the wet rollers remain attached thereto. Liquid receivers 90, FIG. 3, which are an upper and a lower liquid receivers 90A and 90B, are provided to prevent the air bubble generation preventive liquid from being applied from the upper and the lower wet rollers 48A and 48b to the base plate 6 during the dry operation. The wet rollers 48, the liquid receivers 90 and the vicinity of them are described in detail with reference to FIGS. 3, 4, 5, 6, 7, 8, 9, 10 and 11 from now on. FIG. 3 is a perspective view of the wet rollers 48 of the base plate convey-in section 20 and the vicinity thereof, seen upstream with regard to the direction of the conveyance of the base plate 6. FIG. 4 is a perspective view of support means for the shaft of the lower wet roller 48B, seen downstream with regard to the direction of the conveyance, and shows the state that support means for the shaft of the upper wet roller 48A are detached from the apparatus. FIG. 5(A) is a plan view of the support means for the shaft of the upper wet roller 48a, FIG. 5(B) is a front view of the means, and FIG. 5(C) is a side view thereof. The upper and the lower wet rollers 48A and 48B are provided at the most downstream end of the base plate convey-in section 20 so that the rollers face each other to apply the liquid to the upper and lower sides of the base plate 6. Each wet roller 48 is made of a liquid supply tube as a shaft, and a coating layer whose length is sufficiently larger than that of the base plate 6. Since the wet roller 48 is made of the liquid supply tube and the coating layer in the same manner as that disclosed in the Japan Patent Application (OPI) No. 7344/91, the constitution of the roller is not described in detail hereinafter. Wet rollers different in constitution from those 48 may be used instead of them. The liquid supply tube extends along the direction of the width of the base plate 6, and is larger in length than the coating layer. Liquid supply blocks 92 are provided on the wet roller at both the ends of the coating layer, and communicate with the liquid supply tube of the roller so that the liquid is sent into the tube through the blocks to enter into the coating layer in the wet operation of the apparatus. The block 92 includes a guide pin 92A vertically extending through the body of the block, and a spring 92B engaged with the pin to push the upper and the lower wet rollers 48A and 48B toward each other, as shown in FIGS. 4 and 5. FIG. 6 shows the details of the guide pin 92A and the spring 92B.

The shaft support means for the lower wet roller 48B are provided at both the ends thereof outside the liquid supply blocks 92, and include shaft support blocks 94A, block holding members 94B, and position changing knobs 94C, as shown in FIGS. 4 and 5. The lower wet roller 48B is supported at the shaft thereof with bearings provided in the blocks 94A but not shown in the drawings. The block holding members 94B surround the shaft support block 94A at the upper and lower sides thereof and at the right and left sides thereof, which are located in a front and a rear positions at a distance from each other along the direction of the conveyance of the base plate 6. The shaft support block 94A can be vertically moved along the right and the left holding members 94B between them. The upper and the lower holding members 94B are positioned to preset the range of the vertical movement of the block 94A. Each shaft support means also includes positioning screws 94D engaged in the upper and the lower holding members 94B for the presetting. The lower end portion of each position changing knob 94C has a male screw thread engaged with the female screw thread of the upper end portion of the block 94A so that the block can be moved up and down inside the holding members 94B by turning the knob. For that reason, the user of the apparatus can vertically put the lower wet roller 48b into an optional position by turning the knob 94C. The shaft of the lower wet roller 48B extends through the shaft support block 94A at one end of the shaft. A toothed pulley 96A is mounted on the portion of the shaft outside the block 94A. The shaft of the downstream drive roller 38 of the base plate convey-in section 20 extends through a bearing 38A at one end of the shaft. A toothed pulley 96B is mounted on the portion of the shaft of the drive roller 38 outside the bearing 38A. A timing belt 98 is engaged with the toothed pulleys 96A and 96B to transmit the motive power of the drive roller 38 to the lower wet roller 48B through the belt. Gears 100 are provided on the shafts of the upper and the lower wet rollers 48A and 48B inside one of the side plates 19 of the base plate convey-in section 20, and engaged with each other to rotate the rollers simultaneously and equally to each other. The side plates 19 have slits 110, FIG. 6, which vertically extend and are open at the upper ends thereof. A pinch roller 102 is provided over the drive roller 38 in order to push the base plate 6 on the upper side thereof by the weight of the pinch roller to cause the base plate to be horizontally conveyed through between the upper and the lower wet rollers 48A and 48b, and has such a length and such a position that the pinch roller pushes at least part of the base plate even if it is located at the side edge of the base plate conveyance passage. The pinch roller 102 is made of a shaft, and a coating layer of a urethane resin wound on the shaft, and is rotatably and vertically movably supported at the ends of the shaft by plates 104 hung from a pinch roller support member 104 extending along the width of the base plate conveyance passage and secured to the side plates 19 of the convey-in section 20.

Figure 7C:
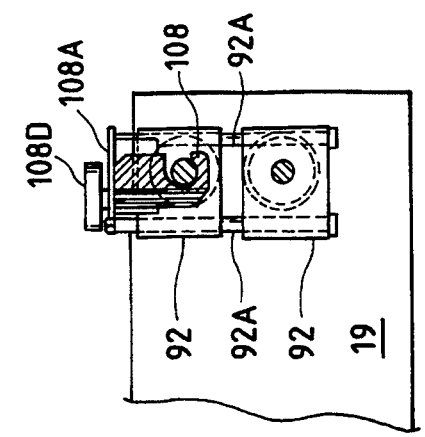
FIG. 7A, 7B and 7C are a plan view, a front view and a side view of the upper and the lower wet rollers and the shaft support means for the upper wet roller, respectively.
Figure 7A:
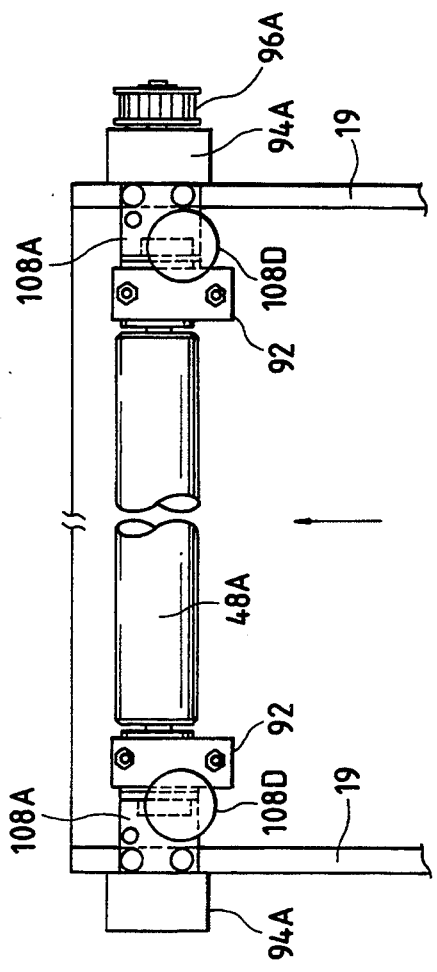
Figure 7B:
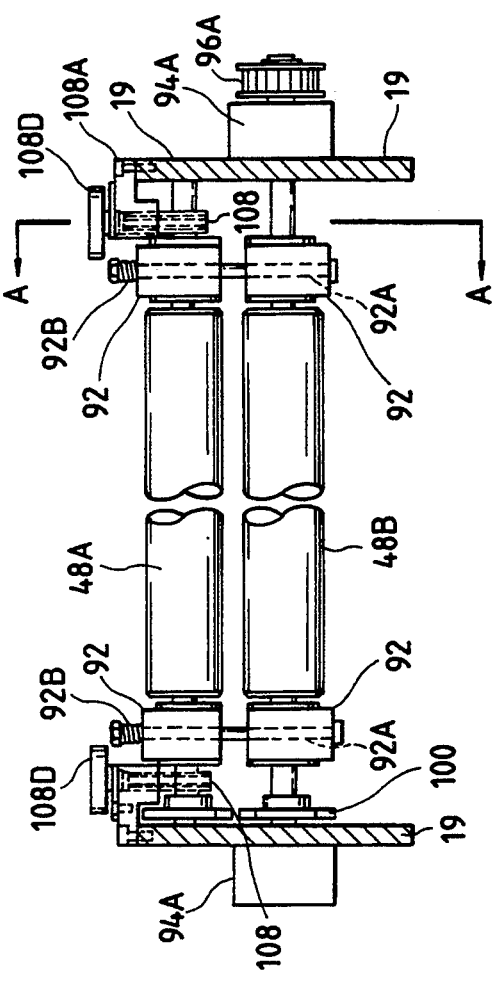

FIG. 6 is a perspective view of the shaft support means for the upper wet roller 48A and the vicinity thereof. FIG. 7(A) is a plan view of the wet roller, FIG. 7(B) is a front view thereof, and FIG. 7(C) is a sectional view thereof along lines A shown in FIG. 7(B). FIGS. 6 and 7 show the state that the shaft support means for the lower wet roller 48B are detached from the apparatus except the shaft support blocks 94A of the means. The shaft support means for the upper wet roller 48A include hooks 108, FIGS. 6 and 7C, curved obliquely upward at the tip portions of the hooks and supporting the roller at the shaft thereof outside the liquid supply blocks 92 on the shaft, hook holders 108A in which the hooks are vertically movably fitted, and position changing knobs 108D whose lower portions have screws engaged in the holders so that the user of the apparatus can vertically put the roller into an optional position by turning the knobs. Since the upper wet roller 48a is engaged on the hooks 108 so as to be supported by them, the shaft support means are simple in constitution. Besides, the wet roller 48A can be easily removed from the hooks 108.

Figure 9:
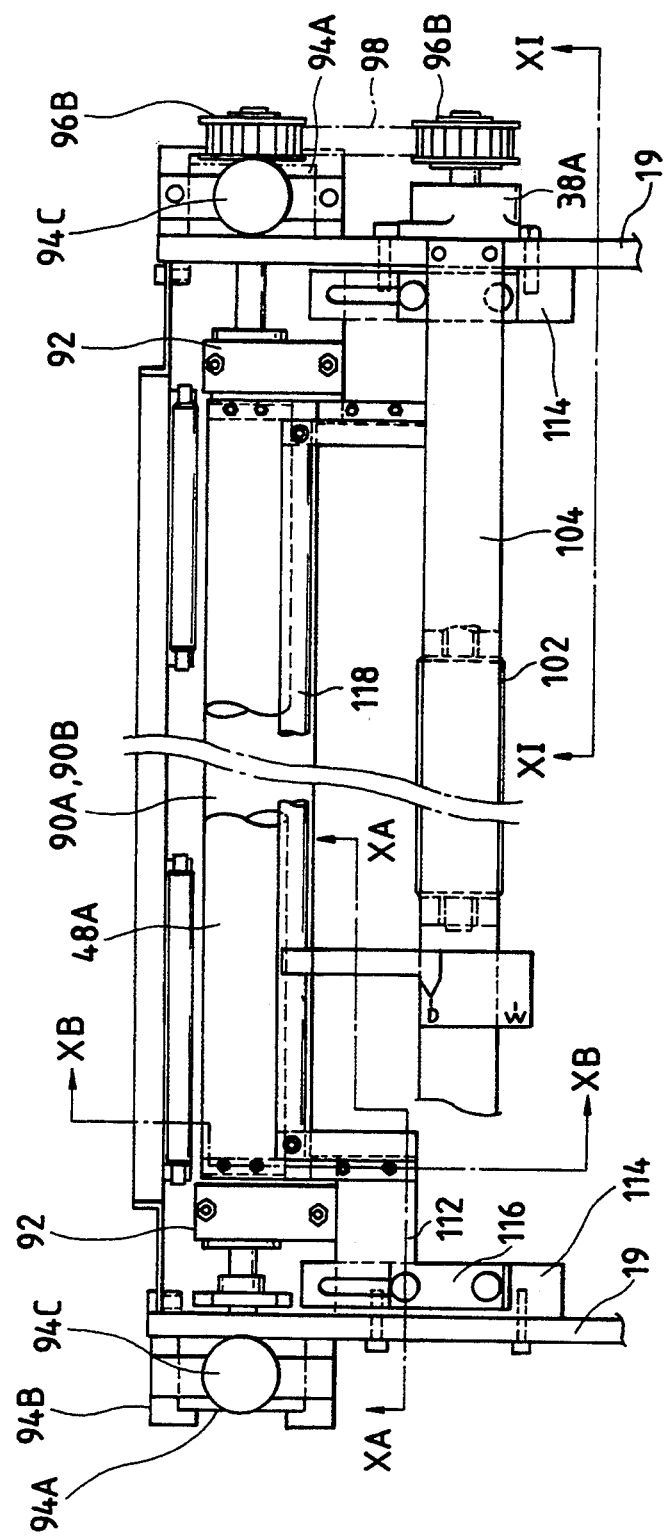
FIG. 9 is a plan view of the liquid receivers and the vicinity thereof.
Figure 10A:
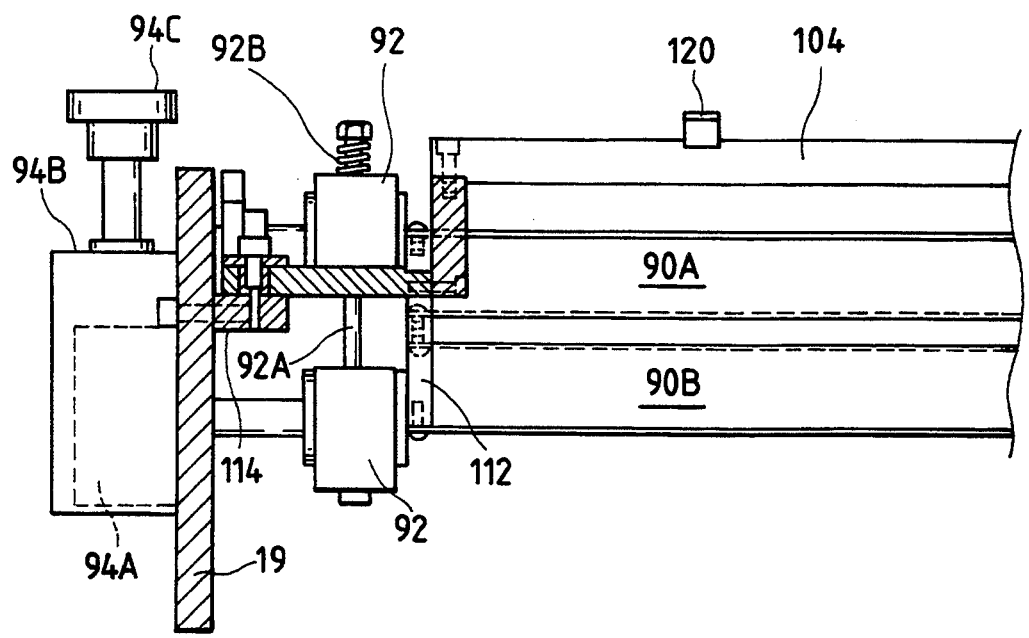
FIG. 10A is a sectional view of the apparatus along a line XA shown in FIG. 9.
Figure 10B:
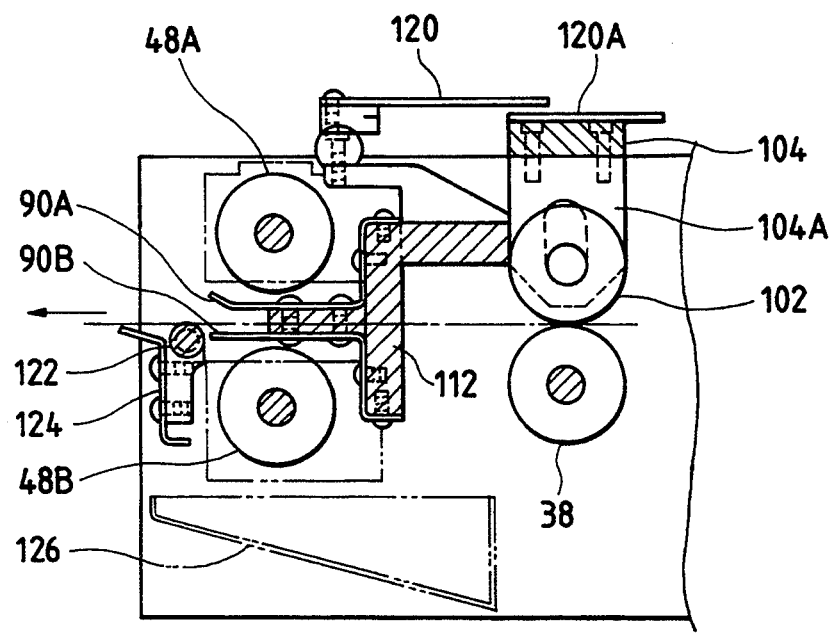
FIG. 10B is a sectional view of the apparatus along a line XB shown in FIG. 9.
Figure 11:
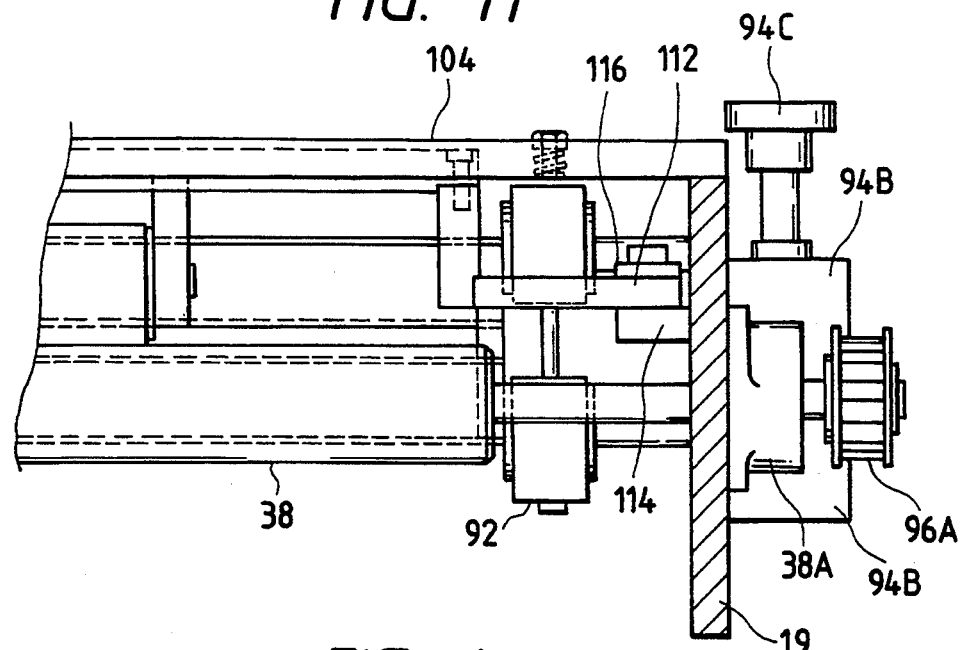
FIG. 11 is a sectional view of the apparatus along a line XI shown in FIG. 9.
Figure 15:
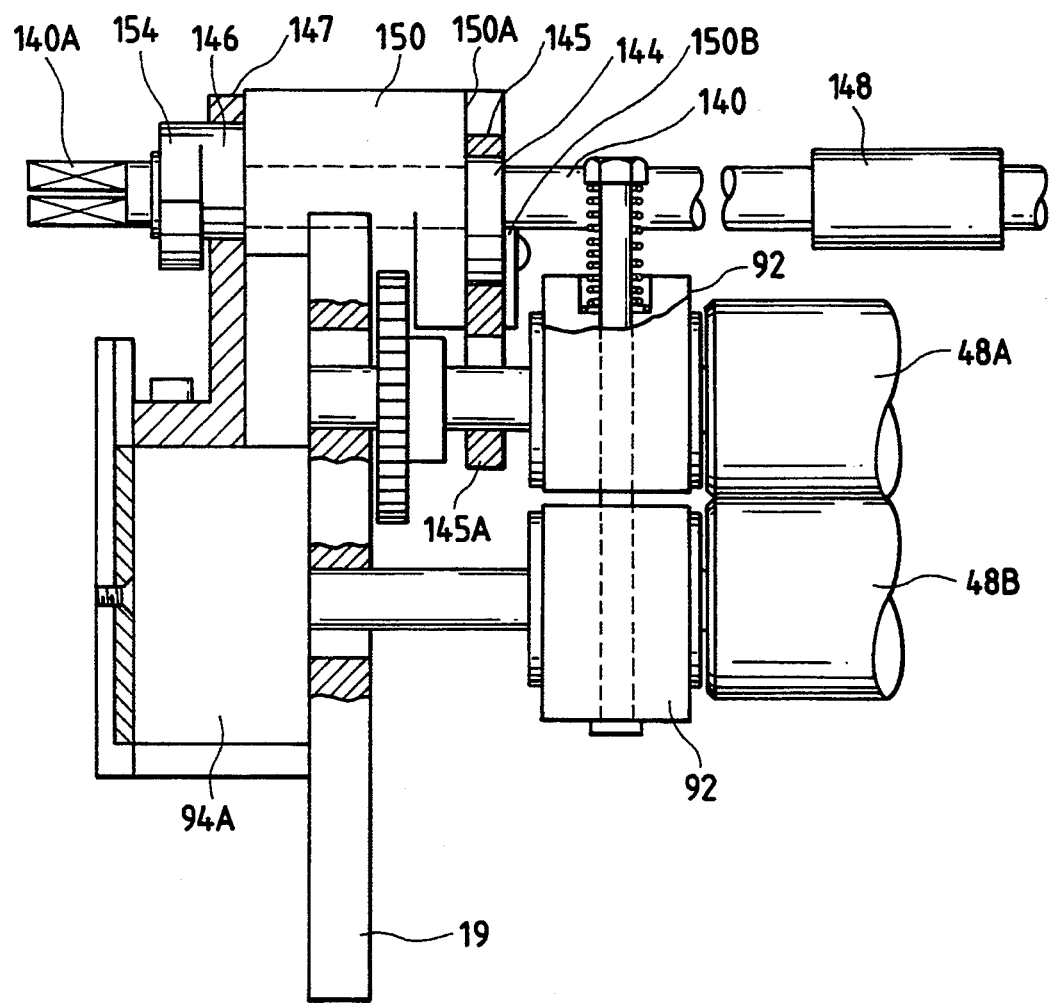
FIG. 15 is an enlarged sectional view showing a vertical position changing mechanism for a wet roller in the second embodiment.

FIG. 8 is a perspective view of the upper and the lower liquid receivers 90A and 90B and the vicinity thereof, seen upstream with regard to the direction of the conveyance of the base plate 6. FIG. 9 is a plan view of the liquid receivers 90a and 90B located between the upper and the lower wet rollers 48A and 48b. FIG. 10(A) is a sectional view of the liquid receivers 90A and 90b and the vicinity thereof along a line XA shown in FIG. 9, FIG. 10(B) is a sectional view of them along a line XB shown therein, and FIG. 11 is a sectional view of them along a line XI shown therein. FIGS. 8, 9 10(A), 10(B), and 11 show the dry operation of the apparatus as well as FIG. 3. Each of the liquid receivers 90a and 90B has a nearly L-shaped cross section, and includes a horizontal plate portion longitudinally extending in parallel with the direction of the width of the base plate conveyance passage and the axial direction of the wet roller and having a width larger than the outside diameter of the roller to prevent the air bubble generation preventive liquid from going from the roller to the base plate 6. The horizontal plate portions of both the liquid receivers 90A and 90B vertically face each other. The horizontal plate portion of the upper liquid receiver 90A is bent obliquely upward at the downstream edge of the portion in order to prevent the liquid from dropping down from the receiver to the base plate 6. The upper and the lower liquid receivers 90A and 90B are supported together at the longitudinal edges thereof by a liquid receiver support member 112. The clearance between the upper and the lower liquid receivers 90A and 90B is such as to enable the base plate 6 to pass through the clearance without being resisted. The support member 112 is disposed on slide members 114 secured to the inner surfaces of the side plates 19, and is secured to the members with hold-down plates 116 by screws. The support member 112 has slender holds over the slide members 114 so that the support member can be moved backward and forward if the screws are loosened. After the support member 112 is put in a proper position through such movement, the hold-down plates 116 are clamped thereon by tightening the screws, to secure the support member in the position. A handhold bar 118 is attached to the support member 112 over it. To change the wet and the dry operations of the apparatus for each other, the user thereof grasps the handhold bar 118 to move the liquid receivers 90a and 90B backward or forward. An operation indicating pointer 120 is provided on the bar 118, and an operation indicating plate 120A is provided on the pinch roller support member 104, to indicate whether the apparatus is in the wet operation or in the dry operation. When the handhold bar 118 is moved backward or forward, the operation indicating pointer 120 is moved together with to enable the user of the apparatus to recognize at a glance whether the apparatus is in the wet operation or in the dry operation.

As shown in FIGS. 3, 8 and 9, support rollers 122 are provided at the downstream sides of the wet rollers 48A and 48B to prevent the base plate 6 from going into trouble such as coming into contact with a liquid drop reception plate 124 while passing through between the wet rollers 48A and 48B or between the liquid receivers 90a and 90b. The support rollers are secured in a right and a left positions to the liquid drop reception plate 124. The base plate leading edge sensor S3 is provided near the plate 124 between the support rollers 122 which prevent the base plate 6 from coming into contact with the sensor. A drain pan 126 is provided under the plate 124 to prevent the air bubble generation preventive liquid from dropping from the wet rollers 48A and 48B to the base of the apparatus or the floor therefor.

Figure 12:
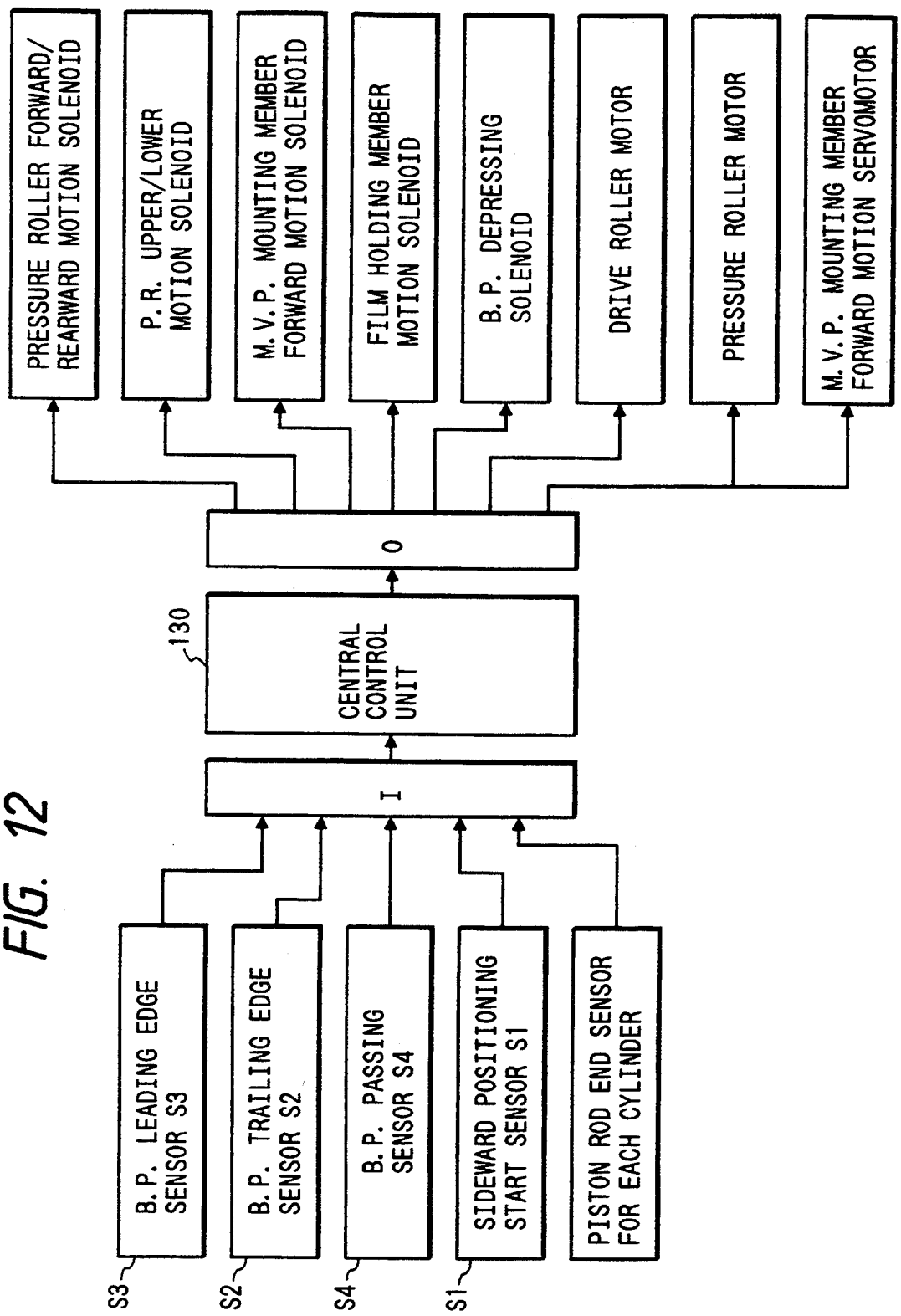
FIG. 12 is a block diagram of the control system of the apparatus to illustrate the sending and reception of electric signals.
Figure 13:
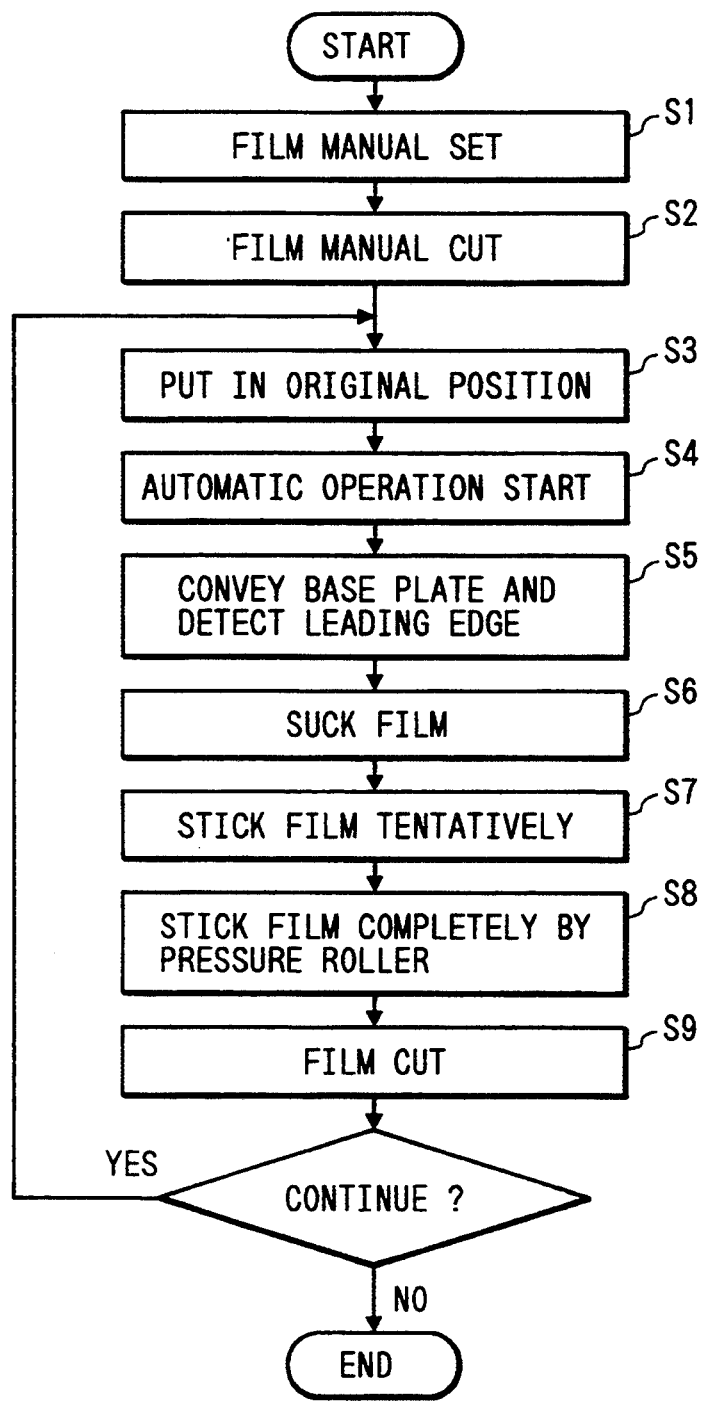
FIG. 13 is a flow chart of a procedure of controlling the apparatus.

FIG. 12 is a block diagram of the control system of the film sticking apparatus to illustrate the sending and reception of electric signals. In the control system, a central control unit 130 sends out control signals for solenoids for the pneumatic cylinders and the motors in response to detection signals from the sensors S1, S2, S3, S4, S36A and S36B, and other sensors which are not shown in the drawings but are for detecting the front and rear ends of the piston rods of the cylinders. The central control unit 130 has counter and time functions as well, and controls the apparatus in a procedure shown in FIG. 13. For example, the control unit 130 is made of a programmable controller or a sequence control relay circuit.

Operating the film sticking apparatus is described in detail from now on. The apparatus is mainly operated in the procedure shown in FIG. 13. Since the upper and lower halves of the apparatus are operated symmetrically to each other, the operation of the upper half is mainly described hereinafter. Before the operation of the apparatus is started, the operation is set to be the wet one or the dry one, on the basis of information about the base plate 6. For the setting, the screws on the hold-down plates 116 are loosened, the liquid receivers 90A and 90B are then moved backward to forward with the handhold bar 118. To perform the wet operation, the liquid receivers 90A and 90B are moved forward reversely to the direction of the conveyance of the base plate 6. To perform the dry operation, the liquid receivers 90A and 90B are moved backward in the direction of the conveyance of the base plate. It can be confirmed in terms of the positional relationship between the operation indicating point 120 and the operation indicating plate 120A whether the liquid receivers 90A and 90B are correctly moved. After the confirmation, the screws are tightened to secure the hold-down plates 116, the liquid receiver support member 112 and the liquid receivers 90A and 90b. The apparatus is then manually put in a film sticking start preparation state in a step 1. At that time, the film supply roller 2 with the three-layer stratified film 1 sufficiently wound thereon is set in the apparatus, the film is unwound from the roller along the guide roller 32 and separated into the light-transmissible resin film 1A and the two-layer stratified film 1B by the film separation roller 3, and the separated two-layer stratified film 1B is fed along the main vacuum suction plate 56 and the cuter 62 while being passed through the gap between the rotary and fixed cutting members 62A and 62B of the cutter, which can be defined between them by manually separating the rotary cutting member from the fixed one. The stratified film 1B is thereafter cut off by the cutter 62 in a step 2. At that time, the rotary cutting member 62A is manually rotated for the cutoff as the rotary and the fixed cutting members 62A and 62B are not inclined. The main vacuum suction plate 56, the pressure sticking roller 28 and so forth are put in their original positions in a step 3. At that time, the upstream end of the main vacuum suction plate 56 is located slightly below the highest ascent position of the end, and the film feed surfaces of the suction plate and the film holding member 60 are put on the same plane.

The apparatus is thereafter put in automatic operation in a step 4. As a result, the film holding member 60 is enabled to such the stratified film 1B on the member and be moved back along the direction of the conveyance of the base plate 6 so that the film is sucked and wound at the leading edge thereof on the tentatively-sticking downstream end portion 56A of the main vacuum suction plate 56. The base plate 6 is introduced into the base plate convey-in section 20 so that after the base plate is detected by th sideward positioning start location sensor S1, the base plate is put into the prescribed position sidewards by the sideward positioners 42. When the leading edge of the base plate 6 thus positioned sidewards is detected by the base plate leading edge sensor S3 during the conveyance of the base plate in the conveyance passage, a detection signal is sent out from the sensor to cause the counter of the central control unit 130 to start counting for a prescribed time, in a step 5. When the counting has been performed for the prescribed time, the leading edge of the base plate 6 is stopped in the tentative sticking position. The detection signal also causes the other counter of the control unit 130 to start counting. When this counting has been performed for a prescribed time, the film holding member 60 is moved back along the direction of the conveyance of the base plate so that the stratified film 1B is sucked and wound on the tentatively-sticking downstream end portion 56A of the main vacuum suction plate 56, in a step 6. By the time when the main vacuum suction plate 56 is moved down to tentatively stick the stratified film 1B to the base plate 6, the base plate hold-down means 44 is driven to move down the base plate hold-down roller 46 to the base plate to pinch it between the roller and the drive roller 38. The air bubble generation preventive liquid is applied to the upper and lower sides of the base plate 6 by the upper and the lower wet rollers 48A and 48B along with the conveyance of the base plate if the wet operation is performed. The main vacuum suction plate 56 is then moved down to tentatively stick the stratified film 1B at the leading edge thereof to the base plate 6, in a step 7.

During the counting by the latter counter, the servomotor is driven to move the upper and the lower main vacuum suction plates 56 simultaneously and equally to each other toward the upper and lower sides of the base plate 6 through the actions of the pinion 70 and the racks 68. The driving of the servomotor is stopped when each of the downstream ends of the main vacuum suction plates 56 is moved to a position having the prescribed distance of 2 cm, for example, from the base plate 6. After that, the pair of pneumatic cylinders provided at both the ends of the upper and the lower main vacuum suction plates 56 are driven to move the plates so that the tentatively-sticking downstream end portions 56A thereof approach the upper and lower sides of the base plate 6 to tentatively stick the stratified films 1B to the upper and lower sides of the base plate under the pushing power of the cylinders. For that reason, the films 1B can be tentatively stuck to both the sides of the base plate 6 by mutually equal forces. At that tim, a brake for the servomotor is disengaged so that the servomotor rotates freely not to transmit the motive power thereof to the pinion 70.

After that, the main vacuum suction plate 56 is moved away from the base plate 6, and the pressure sticking roller 28 is moved froth without interfering with the tentatively-sticking downstream end portion 56A of the suction plate, and starts completely sticking the tentatively-stuck stratified film 1B to the base plate under heat and pressure, in a step 8. When the portion of the stratified film 1B, which is to become the trailing edge of the film when the portion is cut off by the cutter 62, has come to the place of the cutter along with the progress of the sticking of the film to the base plate 6 by the pressure sticking roller 28, the film is sucked on the main vacuum suction plate 56 and cut off by the cutter, in a step 9. At the beginning of the cutoff, the cuter 62 is inclined so that the component of the speed of the movement of the point of the cutoff, in the direction of the feed of the stratified film 1B, is equalized to the speed of the feed to cut off the film perpendicularly to the direction of the feed. During and after the cutoff, the stratified film 1B is guided by the support roller 64 so that even if the diameter of the pressure sticking roller 28 is small, the film is fed forth without sliding on the fixed cutting member 62B of the cutter 62. During the complete sticking of the film 1B to the base plate 6 and after the cutoff, the vacuum suction bar 76 starts sucking the film 1B on the bar so that the film slides on the outer surface of the bar while being completely stuck to the base plate 6 under heat and pressure. When the trailing edge of the film 1B has come to the vicinity of the vacuum suction bar 76, the bar is turned around the pressure sticking roller 28 toward the base plate 6 so that the bar keeps sucking the film on the bar until immediately before the termination of the sticking of the film to the base plate. For that reason, an appropriate tensile force is applied to the film 1B to prevent it from undergoing a wrinkle or the like, in the step 9. The main vacuum suction plate 56 and the film holding member 60 such the film 1B on them along with the start of the cutoff of the film by the cutter 62, and are moved toward the base plate 6 at the same speed as the complete sticking of the film to the plate along with the cutoff of the film. Immediately after the cutoff, moving the main vacuum suction plate 56 and the film holding member 60 toward the base plate 6 is stopped.

It is then judged whether the film sticking operation of the apparatus should be continued or not. If it is judged that the film sticking operation should be continued, the steps 5, 6, 7, 8 and 9 are taken again. If it is not judged so, the operation is ceased.

The film sticking apparatus is not confined to the constitution shown in the drawings, but may have other constitution which allows the wet rollers 48A and 48B to be fixedly provided in the apparatus so that each of the wet and the dry operations can be performed.

Although the vertical position of the wet roller 48B can be optionally changed by rotating the position change knobs 94C screw-engaged with the bearing blocks 94A supporting the roller and that of the other wet roller 48A can be optionally changed by rotating the other position change knobs 108D screw-engaged with the hook holders 108A, the present invention is not confined thereto but may be otherwise embodied. For example, the vertical positions of such wet rollers 48A and 48B may be optionally changed through the use of cam mechanisms in which right and left members are moved synchronously with each other for the change, as is performed in another of the embodiments, and described with reference to FIGS. 14, 15, 16 and 17 from now on. Parts shown in these drawings and equivalent to those shown in the preceding ones are denoted by the same reference symbols as the latter, and not described in detail hereinafter.

The wet rollers 48A and 48B are connected to each other through a connection shaft 140 extending over them in parallel therewith, so that the vertical positions of the rollers can be changed through the synchronous movement of the right and the left members by rotating the shaft with a crank 142, to modulate the vertical distance between the rollers. A pair of inner and outer eccentric cams 144 and 146 are secured to the connection shaft 140 at each of both the ends thereof, and differ from each other in phase by an angle of 180 degrees. Both the inner eccentric cams 144 are slidably engaged with 9-shaped cam followers 145 so that they constitute positive cam means. Each of the cam followers 145 has a hook portion 145A at the lower end of the follower, and supports the shaft of the wet roller 48A at the hook portion. The hook portion 145A corresponds to the hook 108 of the preceding embodiment. The wet roller 48A can be vertically moved by vertically moving the hook portion 145A depending on the quantity of the eccentricity of the eccentric cam 144. Both the outer eccentric cams 146 are slidably engaged with U-shaped cam followers 147 coupled to bearing blocks 94A at the upper ends thereof. The bearing blocks 94A support the other wet roller 48B so that they are vertically moved together by rotating the eccentric cams 146.

The connection shaft 140 has an end part 140A projecting from the outer eccentric cam 146 and having an angular cross section so that the crank 142 can be removably fitted on the end part. The shaft 140 consists of a right and a left portions conjoined to each other by an intermediate coupling 148, and is rotatably supported by support blocks 150 secured to side plates 19 over them and supporting the cam followers 145 so that they are slidable up and down. The cam followers 145 are fitted in the recesses 150A of the support blocks 150 to which cover plates 150B are secured to cover the followers to keep them from coming off.

A click mechanism 152 is provided outside one of the outer eccentric cams 146, and includes a ring 154 secured to the connection shaft 140 outside the cam, a click ball 158 supported at the tip of a bracket 156 projecting from the support block 150 and facing the peripheral surface of the ring, and a spring 158B fitted in a hole 158A and urging the ball toward the ring. The ring 154 has a pair of click dimples 154A and 154B at an angular interval of 180 degrees so that the click ball 158 is put in the dimples during the rotation of the connection shaft 140 to give a feeling of boundary at every 180-degree angle of the rotation. Stopper pins 154C and 154D are planted in the peripheral surface of the ring 154 to allow the shaft 140 and the ring to be rotated only by an angle of 180 degrees.

Figure 16:
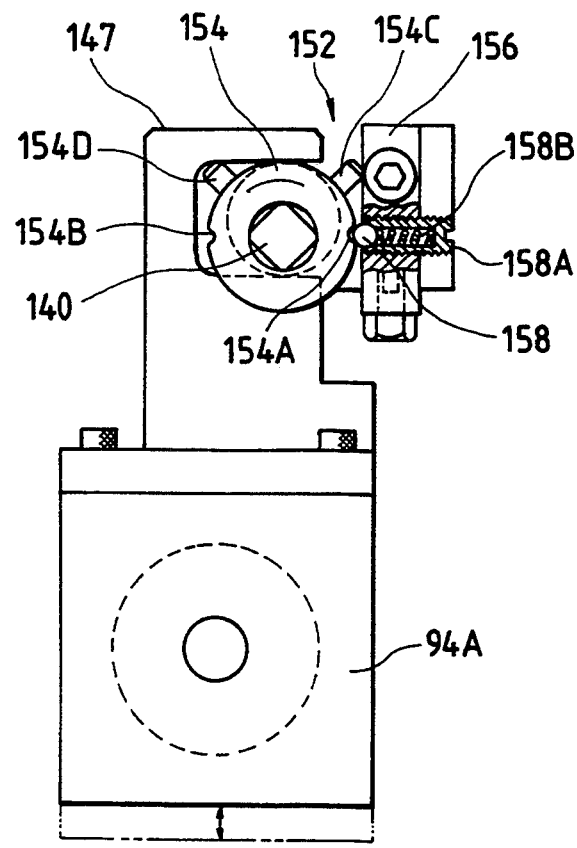
FIG. 16 is a front view showing a click mechanism in the second embodiment.
Figure 17:
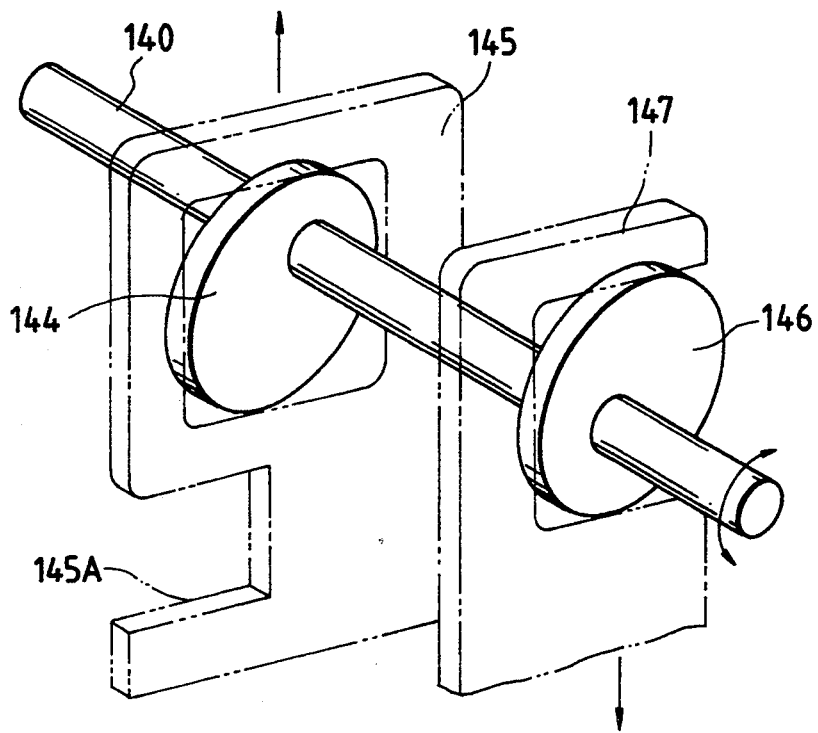
FIG. 17 is a perspective view showing a connection shaft, eccentric cams and cam followers in the second embodiment.
Figure 18:
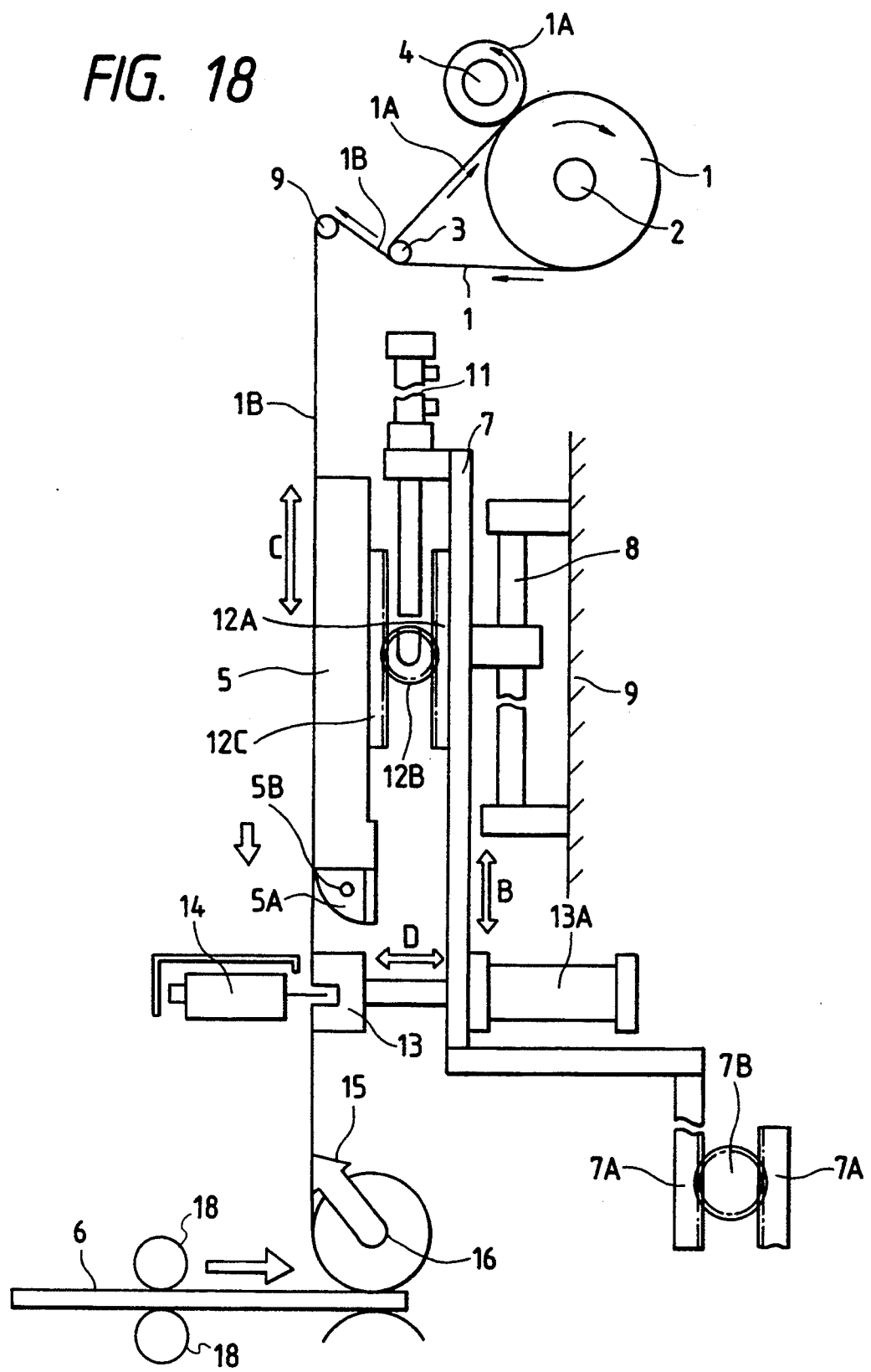
FIG. 18 is a side view of a conventional film sticking apparatus.

When the connection shaft 140 to which the inner and the outer eccentric cams 144 and 146 are secured with the angular phase difference of 180 degrees is rotated with the crank 142 clockwise as to FIG. 16 so as to put the stopper pin 154C at the travel end thereof, the wet rollers 48A and 48B are located vertically nearest each other through the action of the cams and the cam followers 145 and 147. At that time, the rollers 48A and 48B are fully opened from each other by a distance equal to the sum of the lifts of the inner and the outer eccentric cams 144 and 146 in each pair. The connection shaft 140 can thus be rotated with the crank 142 thereon at only one end of the shaft to easily and quickly move the upper and the lower wet rollers 48A and 48B up and down through the synchronous movement of the right and the left members at both the ends of the shaft to open and close the rollers from and to each other while keeping the distance between them uniform. Since the crank 142 can be removed from the shaft 140 when it does not need to be rotated, a film sticking apparatus which is this embodiment can be put in a smaller space. The apparatus is the same in other constitution and operation as the preceding apparatus.

Although the angular phase difference between the inner and the other eccentric cams 144 and 146 is 180 degrees, the present invention is not confined thereto but the difference may be set to be less or more than 180 degrees. Although the cams 144 and 146 are rotated with the shaft 140 to modulate the vertical distance between the upper and the lower wet rollers 48A and 48B, the present invention may be otherwise embodied so that screw mechanisms are provided to be driven with such a shaft to modulate the distance.

The slide motion of the liquid receivers 90A and 90B may be linked with the rotation of the connection shaft 140. Again, it is possible to drive the connection shaft 140 with a stepping motor.

Although the wet rollers 48A and 48B are provided in each of the film sticking apparatuses so that the rollers can be located either for the wet operation of the apparatus or for the dry operation thereof, such wet rollers may be provided in other types of film sticking apparatuses in accordance with the present invention so that the rollers can be located for similar operations.

According to the present invention, a wet operation in which an air bubble generation preventive liquid is applied to a base plate, and a dry operation in which the liquid is not applied to the plate can be easily changed for each other in a short time. Therefore, the changing does not much increase a work load, and not much impede a continuous rapid operation. A desirable effect is thus produced.

What is claimed is:

1. A film sticking apparatus comprising:
    a pressure sticking roller for sticking a film onto a surface of a base plate under heat and pressure while conveying said base plate along a base plate conveyance passage;
    a wet roller for applying an air bubble generation preventive liquid to said base plate so that said film is stuck to said base plate by said pressure sticking roller as said liquid remains applied to said surface; and
    means for preventing said liquid from being applied from said wet roller to said plate, said preventing means comprising a liquid receiver movable along said passage into a space between said base plate and said wet roller.

2. A film sticking apparatus according to claim 1, wherein said wet roller is disposed upstream of said passage relative to said pressure sticking roller, and said means for preventing further comprises means for adjustably moving said wet roller toward and away from said passage in a vertical direction of said passage so as to be selectively brought into contact with said base plate.

3. A film sticking apparatus having a base plate conveyance passage along which a base plate is conveyed, comprising:
    first and second pressure sticking rollers disposed in opposition to each other across said base plate conveyance passage for sticking films onto respective sides of said base plate while clamping said base plate;
    first and second wet rollers disposed in opposition to each other across said base plate conveyance passage and disposed upstream of said first and second pressure sticking roller for applying an air bubble generation preventive liquid to respective sides of said base plate, said first and second wet rollers being movable toward and away from each other and selectively contactable with respective sides of said base plate;
    a liquid application preventive member having first and second plate portions, said liquid application preventive member being movable along said base plate conveyance passage so that each of said first and second plate portions is inserted into a space between said base plate and a corresponding one of said first and second wet rollers.

4. The film sticking apparatus according to claim 3, wherein said first and second wet rollers are independently movable with respect to each other.

5. The film sticking apparatus according to claim 3, wherein said first and second wet rollers are linked with each other.

6. The film sticking apparatus according to claim 3, wherein said first and second plate portions are spaced apart from each other so as to permit said base plate to pass therebetween without being resisted.

7. A film sticking apparatus according to claim 1, wherein said means for preventing comprises:
    a liquid application preventive member for preventing said liquid from being applied from said wet roller to said plate; and
    an operation selection means for selecting a liquid applying operation or a liquid non-applying operation by moving said member out from between said roller and said base plate conveyance passage or in therebetween.

* * * * *